United States Patent
Park et al.

(10) Patent No.: US 7,990,047 B2
(45) Date of Patent: Aug. 2, 2011

(54) ORGANIC LIGHT EMITTING DIODE DISPLAY AND METHOD OF MANUFACTURING THE SAME

(75) Inventors: Seung-Kyu Park, Hwaseong-si (KR); Jong-Moo Huh, Hwaseong-si (KR); Nam-Deog Kim, Yongin-si (KR); Kyoung-Ju Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 432 days.

(21) Appl. No.: 11/535,222

(22) Filed: Sep. 26, 2006

(65) Prior Publication Data

US 2007/0096636 A1    May 3, 2007

(30) Foreign Application Priority Data

Oct. 28, 2005  (KR) .................. 10-2005-0102250
Oct. 28, 2005  (KR) .................. 10-2005-0102254

(51) Int. Cl.
*H01L 51/52* (2006.01)

(52) U.S. Cl. ...................... 313/504; 313/506

(58) Field of Classification Search .......... 313/498–512; 315/169.1, 169.3; 428/690–691, 917; 438/26–29, 438/34, 82; 427/58, 64, 66, 532–535, 539; 257/40, 72, 98–100, 642–643, 759; 445/24–25
See application file for complete search history.

(56) References Cited

U.S. PATENT DOCUMENTS

| | | | |
|---|---|---|---|
| 6,046,547 A * | 4/2000 | Nishio et al. | 315/169.3 |
| 6,072,450 A * | 6/2000 | Yamada et al. | 345/76 |
| 6,778,114 B2 | 8/2004 | Chung | |
| 6,872,114 B2 | 3/2005 | Chung et al. | |
| 7,148,508 B2 * | 12/2006 | Miyazawa | 257/72 |
| 2001/0001050 A1 * | 5/2001 | Miyashita et al. | 428/690 |
| 2002/0064966 A1 * | 5/2002 | Seki et al. | 438/780 |
| 2003/0201716 A1 * | 10/2003 | Yamazaki et al. | 313/506 |
| 2003/0227253 A1 * | 12/2003 | Seo et al. | 313/504 |
| 2004/0017153 A1 | 1/2004 | Nishikawa | |
| 2004/0070335 A1 * | 4/2004 | Cok | 313/506 |
| 2004/0222740 A1 * | 11/2004 | Kim | 313/506 |
| 2005/0077819 A1 * | 4/2005 | Park | 313/504 |
| 2005/0082534 A1 | 4/2005 | Kim et al. | |
| 2005/0194894 A1 * | 9/2005 | Sato | 313/504 |
| 2005/0200300 A1 * | 9/2005 | Yumoto | 315/169.1 |
| 2005/0225232 A1 * | 10/2005 | Boroson et al. | 313/504 |
| 2006/0138942 A1 * | 6/2006 | Bang et al. | 313/504 |
| 2006/0228974 A1 * | 10/2006 | Thelss et al. | 445/24 |

FOREIGN PATENT DOCUMENTS

| | | |
|---|---|---|
| JP | 2000040584 | 2/2000 |
| JP | 2001135477 | 5/2001 |
| JP | 2002208489 | 7/2002 |

(Continued)

*Primary Examiner* — Nimeshkumar D Patel
*Assistant Examiner* — Donald L Raleigh
(74) *Attorney, Agent, or Firm* — Cantor Colburn LLP

(57) ABSTRACT

A method of manufacturing an organic light emitting diode display includes forming a plurality of signal lines and a plurality of TFTs on a substrate, forming a passivation layer on the signal lines and the TFTs, forming a photosensitive layer having a plurality of openings on the passivation layer, etching the passivation layer using the photosensitive layer as a mask, forming a first electrode by depositing and etching a conductive layer on substantially the entire surface including the photosensitive layer, forming a light emitting member in portions of the openings, and forming a second electrode on the light emitting member and the photosensitive layer.

24 Claims, 34 Drawing Sheets

FOREIGN PATENT DOCUMENTS

| | | |
|---|---|---|
| JP | 2003086372 | 3/2003 |
| JP | 2003163081 | 6/2003 |
| JP | 2004127551 | 4/2004 |
| JP | 2004234901 | 8/2004 |
| JP | 2004235019 | 8/2004 |
| JP | 2004335276 | 11/2004 |
| JP | 2005174914 | 6/2005 |
| KR | 100281045 | 11/2000 |
| KR | 1020040010342 | 1/2004 |
| KR | 1020040019186 | 3/2004 |
| KR | 1020040039791 | 5/2004 |
| KR | 1020040048517 | 6/2004 |
| KR | 1020050016838 | 2/2005 |
| KR | 100504571 | 7/2005 |
| KR | 1020050068192 | 7/2005 |
| KR | 1020050068853 | 7/2005 |

* cited by examiner

ORGANIC LIGHT EMITTING DIODE DISPLAY AND METHOD OF MANUFACTURING THE SAME

This application claims priority to Korean Patent Application No. 10-2005-0102250 and Korean Patent Application No. 10-2005-0102254, both filed on Oct. 28, 2005, the contents of which in their entirety are herein incorporated by reference.

BACKGROUND OF THE INVENTION (a) Field of the Invention

The present invention relates to an organic light emitting diode ("OLED") display and a method of manufacturing the same.

(b) Description of the Related Art

Recently, thin and light-weight types of monitors and television sets have grown in popularity. Cathode ray tubes ("CRTs.") have been increasingly replaced by liquid crystal displays ("LCDs").

However, since the LCD is a non-emissive display device, a backlight is needed in the construction of most LCD displays. Reflective LCDs may use ambient light in order to display images, however they are not ideal for all applications. In addition, LCDs have limitations in their response speed and a viewing angle. Recently, as a display capable of overcoming the aforementioned problems, an organic light emitting diode ("OLED") display has been proposed.

An OLED display includes two electrodes and a light emitting layer interposed therebetween. An electron injected from the one electrode and a hole injected from the other electrode are combined in the organic light emitting layer to form an exciton, and the exciton discharges energy to emit light.

Since the OLED display is a self-emissive display device, a backlight is not needed. Therefore, the OLED display has an advantage in power consumption and can be manufactured as a thinner structure. In addition, the OLED display has a faster response speed, wider viewing angle, and higher contrast ratio than that of a comparable LCD.

An OLED display can be classified into a passive matrix OLED display and an active matrix OLED display according to its driving mode. Among these, an active matrix OLED display, which uses thin film transistors ("TFTs") as a switching and driving device to drive each individual pixel, has advantages in that high resolution, low power consumption and a wide screen can be achieved.

An OLED display may further be classified into a bottom emission type display, which emits light to an outside through a bottom substrate, or a top emission type display, which emits light to an outside through a common electrode.

The active matrix OLED display primarily includes the TFT, an organic light emitting member, and partition walls for defining the organic light emitting members into individual pixels.

The partition walls protect the TFT, prevent a light emitting material in a pixel from mixing with another light emitting material in an adjacent pixel, and prevent a short circuit between an anode and a cathode.

However, since the partition walls are formed by a photolithography process, the number of masks for the process increases, thereby increasing manufacturing costs.

In addition, in order to improve the brightness of the OLED display, a light-emission amount per each unit pixel has to be increased, as opposed to the LCD where the output of the single backlight unit can be increased.

In order to increase the amount of light emission, a method of increasing efficiency of a light-emitting material and a method of increasing a current applied to the unit pixel electrode have been proposed.

However, there is a limitation to the efficiency obtainable from a light emitting material. In addition, there is also a limit to the amount of current which can be applied to the unit pixel electrode in order to maintain the lifetime and efficiency of the OLED display and TFT.

BRIEF SUMMARY OF THE INVENTION

An aspect of the present invention is to provide an organic light emitting diode display and method of manufacturing the same that is capable of reducing the number of masks, thereby simplifying the manufacturing processes, and at the same time increasing a light emitting amount per unit pixel.

According to an exemplary embodiment of the present invention, there is provided an organic light emitting diode display including; a substrate, a first signal line formed on the substrate, a second signal line intersecting the first signal line, a plurality of thin film transistors ("TFTs") formed on the substrate and electrically connected to the first and second signal lines, a passivation layer formed on the TFTs, a photosensitive layer formed on the passivation layer and having a first opening, a first electrode connected to one of the TFTs and separated from the photosensitive layer, a light emitting member formed on the first electrode and defined by the photosensitive layer, and a second electrode formed on the light emitting member.

The first electrode may have a smaller area than that of the first opening.

A boundary of the first electrode may be disposed in the first opening, while contacting the light emitting member.

The first electrode may be disposed inside the first opening and is separated from the photosensitive layer by about 1 μm to about 5 μm.

One of the TFTs and the first electrode may have side contact.

The first electrode may contact the substrate.

At least a portion of the light emitting member may overlap the TFTs.

The passivation layer may be removed from the first opening.

Portions of the photosensitive layer surrounding the first opening may be used as partition walls.

The photosensitive layer may further include a second opening, and a connecting member connecting a plurality of TFTs may be formed in the second opening and may be separated from the photosensitive layer.

The organic light emitting diode display may further include a first insulating member on the connecting member.

The passivation layer may be removed from the second opening.

The connecting member may contact the substrate.

The passivation layer and the photosensitive layer may include a single-layered organic layer.

The organic layer may be made of a photo-curable material.

The organic light emitting diode display may further include a second insulating member formed in the first opening and having a thickness which differs from that of the first opening.

The second insulating member may include the same material as that of the photosensitive layer.

The second insulating member may include at least one of a concave and a convex portion.

According to another exemplary embodiment of the present invention, there is provided an organic light emitting diode display including; a substrate, a first signal line formed on the substrate, a second signal line intersecting the first signal line, a plurality of TFTs formed on the substrate and are electrically connected to the first and second signal lines, an insulating layer formed on the TFTs and having a first portion and a second portion which is thinner than the first portion, the second portion having at least one of a concave portion and a convex portion, a first electrode formed on the insulating layer, a light emitting member formed on the first electrode; and a second electrode formed on the light emitting member.

The insulating layer may have a third portion which is thinner than the first portion, and the third portion may be formed on an end portion of at least one of the first and second signal lines.

The first portion of the insulating layer may have an opening, and a connecting member may be formed in the opening and a connecting member is formed therein, wherein the connecting member may be separated from the insulating layer and connects a plurality of the TFTs.

According to an exemplary embodiment of the present invention, there is provided a method of manufacturing an organic light emitting diode display including; forming a plurality of signal lines and a plurality of TFTs on a substrate, forming a passivation layer on the signal lines and the TFTs, forming a photosensitive layer having a plurality of openings on the passivation layer, etching the passivation layer using the photosensitive layer as a mask, forming a first electrode by depositing a conductive layer on substantially the entire surface including the photosensitive layer and etching the conductive layer to form the first electrode, forming a light emitting member in portions of the openings, and forming a second electrode on the light emitting member and the photosensitive layer.

In the etching of the passivation layer, portions of the TFTs may be exposed.

The method further may include forming an insulating member in the portions of the openings after the formation of the first electrode.

A shadow mask may be used in the formation of the insulating member.

In the formation of the first electrode, the first electrode may be formed to be spaced apart from the photosensitive layer.

The method may further include curing the photosensitive layer after the etching of the passivation layer.

In the formation of the passivation layer and the formation of the photosensitive layer, the passivation layer and the photosensitive layer may be formed by depositing a single-layered organic layer.

In the etching the passivation layer, portions of the photosensitive layer may be subject to a slit process developing.

In the formation of the photosensitive layer, the photosensitive layer may be patterned to have a first portion and a second portion which is thinner than the first portion, the second portion having at least one of a concave portion and a convex portion.

A slit mask may be used in the formation of the photosensitive layer.

The formation of the photosensitive layer may further include forming a third portion in which the photosensitive layer is removed, and the method of manufacturing an organic light emitting diode display may further include forming an insulating member in the third portion after the formation of the first electrode.

According to another exemplary embodiment of the present invention, there is provided a method of manufacturing an organic light emitting diode display including; forming a plurality of signal lines and a plurality of TFTs on a substrate, forming an organic insulating layer on the signal lines and the TFTs, forming openings which expose portions of the TFTs by removing portions of the organic insulating layer, forming a first electrode by depositing a conductive layer on substantially the entire surface including the organic insulating layer and etching the conductive layer to form the first electrode, forming a light emitting member on portions of the openings, and forming a second electrode on the light emitting member and the organic insulating layer.

The method may further include forming an insulating member in the portions of the openings after the formation the first electrode.

A shadow mask may be used in the formation of the insulating member.

In the formation of the first electrode, the first electrode may be formed be apart from the organic insulating layer.

According to another exemplary embodiment of the present invention, there is provided an organic light emitting diode display including; a substrate, a first signal line formed on the substrate, a second signal line intersecting the first signal line, a plurality of TFTs formed on the substrate and electrically connected to the first and second signal lines, a passivation layer formed on the TFTs, partition walls formed on the passivation layer and having a first opening, a first electrode contacting at least one portion of the substrate in the first opening, a light emitting member formed on the first electrode and defined by the partition walls, and a second electrode formed on the light emitting member.

The first electrode may have an area which is smaller than that of the first opening.

The first electrode may be inside the first opening and may be separated by about 1 μm to about 5 μm.

One of the TFTs and the first electrode may have side contact.

The passivation layer may be removed from the first opening.

The partition walls may have a second opening, and a connecting member may be formed in the second opening and the light emitting diode display further includes a connecting member formed in the second opening which contacts the substrate and connects a plurality of the TFTs.

The organic light emitting diode display may further include an insulating member on the connecting member.

According to another aspect of the present invention, there is provided an organic light emitting diode display including; a substrate, a first signal line formed on the substrate, a second signal line intersecting the first signal line, a switching TFT formed on the substrate and connected to the first and second signal lines, a driving TFT connected to the switching TFT, a driving voltage line connected to the driving TFT, a passivation layer formed on the entire surface of the substrate, a photosensitive layer formed on the passivation layer and having a first opening, a first electrode connected to the driving TFT and separated from the photosensitive layer, a light emitting member formed on the first electrode and defined by the photosensitive layer, and a second electrode formed on the light emitting layer.

BRIEF DESCRIPTION OF THE DRAWINGS

The above and other aspects, features and advantages of the present invention will become more apparent by describing exemplary embodiments thereof in further detail with reference to the attached drawings, in which.

DETAILED DESCRIPTION OF THE INVENTION

Figure 1:
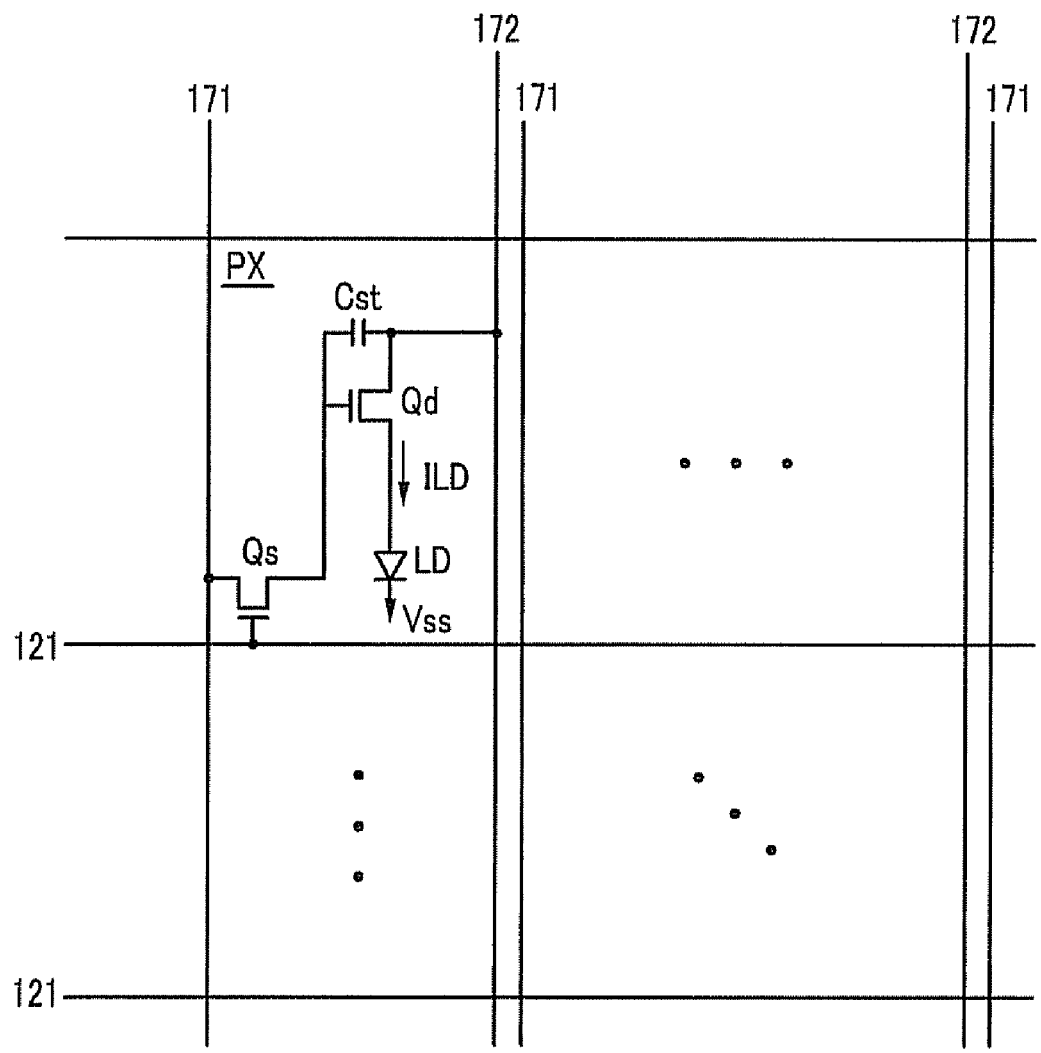
FIG. 1 is an equivalent circuit diagram of an exemplary embodiment of an organic light emitting diode ("OLED") display according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

First, an organic light emitting diode ("OLED") display according to an exemplary embodiment of the present invention will be described with reference to FIG. 1.

FIG. 1 is an equivalent circuit diagram of an exemplary embodiment of the OLED display according to the present invention;

Referring to FIG. 1, the exemplary embodiment of an OLED display includes a plurality of signal lines 121, 171 and 172 and a plurality of pixels connected to the lines and arrayed substantially in a matrix.

The signal lines include a plurality of gate lines 121 for transmitting gate signals or scan signals, a plurality of data lines 171 for transmitting data signals, and a plurality of driving voltage lines 172 for transmitting driving voltages.

The gate lines 121 mainly extend in a row direction and are substantially parallel to each other, and the data lines 171 and the driving voltage lines 172 mainly extend in a column direction and are substantially parallel to each other.

Each of the pixels includes a switching transistor Qs, a driving transistor Qd, a storage capacitor Cst, and the organic light emitting diode ("OLED") LD.

The switching transistor Qs includes a control terminal, an input terminal, and an output terminal. The control terminal is connected to the gate line 121, the input terminal is connected to the data line 171, and the output terminal is connected to the driving transistor Qd and a first side of the storage capacitor Cst.

The switching transistor Qs transmits the data signals applied to the data line 171 to the driving transistor Qd in response to the scan signals applied to the gate line 121.

The driving transistor Qd also includes a control terminal, an input terminal, and an output terminal. The control terminal is connected to the switching transistor Qs and the first side of the storage capacitor Cst, the input terminal is connected to the driving voltage line 172 and a second side of the storage capacitor Cst, and the output terminal is connected to the OLED LD.

The driving transistor Qd outputs an output current ILD, the magnitude of which changes according to a voltage applied between the control terminal and the output terminal thereof.

The capacitor Cst is connected between the control terminal and the input terminal of the driving transistor Qd and is also connected to the driving voltage line 172.

The capacitor Cst charges the data signals applied to the control terminal of the driving transistor Qd and sustains the signals even when the switching transistor Qs is turned off.

The OLED LD includes an anode connected to the output terminal of the driving transistor Qd and a cathode connected to a common voltage Vss.

The OLED LD emits light with different intensities according to the magnitude of the output current ILD of the driving transistor Qd. A plurality of OLEDs LD may be arranged together so that an image can be displayed.

According to one exemplary embodiment, the switching transistor Qs and the driving transistor Qd may be n-channel field effect transistors ("FETs").

Alternative exemplary embodiments include configurations where at least one of the switching transistor Qs and the driving transistor Qd may be a p-channel field effect transistor.

Although not herein described, variations in the connections between the transistors Qs and Qd, the capacitor Cst, and the OLED LD are within the scope of the present invention.

Now, a detailed structure of the OLED display shown in FIG. 1 is described in detail with reference to FIGS. 1, 2, and 3.

Figure 2:
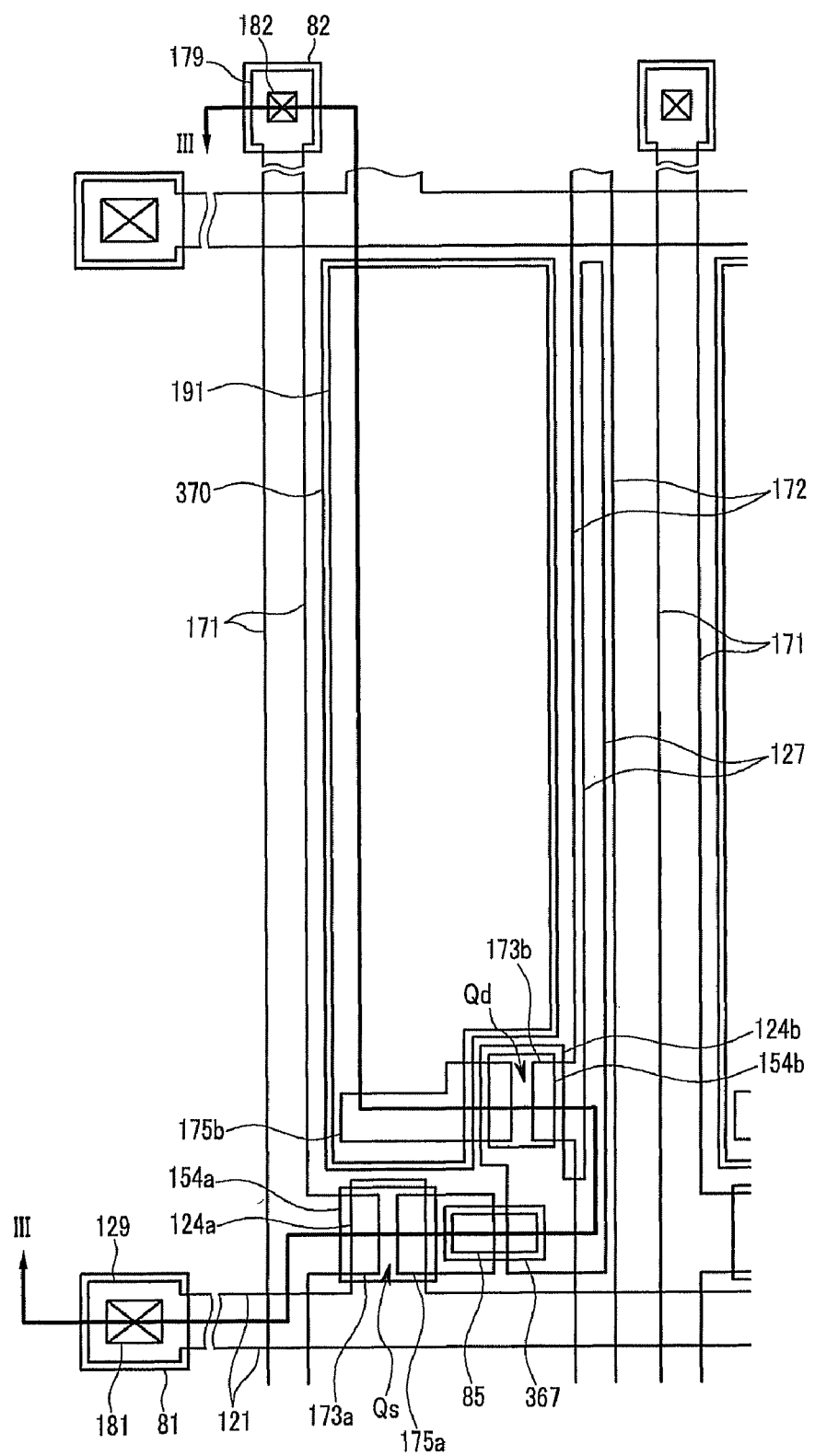
FIG. 2 is a top plan layout view of an exemplary embodiment of a pixel in an OLED display according to the present invention.
Figure 3:
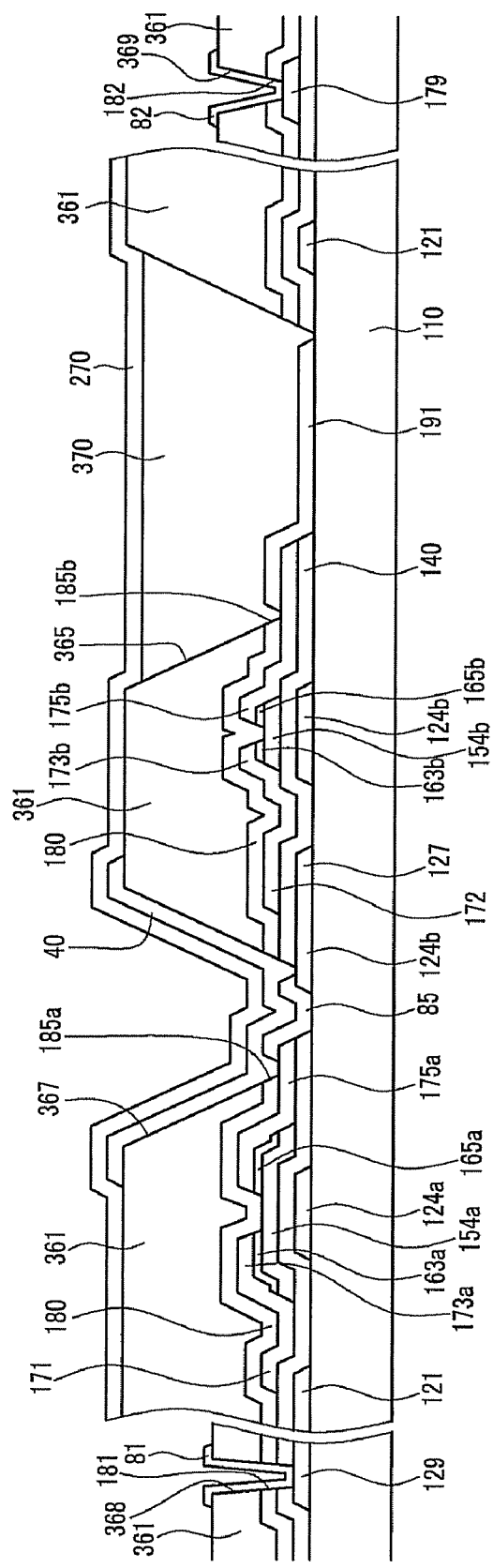
FIG. 3 is a cross-sectional view of the exemplary embodiment of an OLED display taken along line III-III of FIG. 2.

FIG. 2 is a top plan view of an exemplary embodiment of a pixel in the OLED display according to the present invention, and FIG. 3 is a cross-sectional view of the exemplary embodiment of an OLED display taken along line III-III of FIG. 2.

A plurality of gate conductors including a plurality of the gate lines 121 which include a plurality of first control electrodes 124a and a plurality of second control electrodes 124b are formed on a insulating substrate 110 made of transparent glass, plastic, or other similar substances.

The gate lines 121 mainly extend in a transverse direction to transmit the gate signals.

Each of the gate lines 121 includes an end portion 129 having a large area to connect to an external driving circuit (not shown) or other layers. The first control electrode 124a extends in an upward direction extending from the gate line 121.

Alternative exemplary embodiments include configurations where a gate driving circuit (now shown) for generating the gate signals is integrated with the substrate 110. In such an exemplary embodiment, the gate line 121 may extend to directly connect to the gate driving circuit.

The second control electrode 124b is separated from the gate line 121 and includes a storage electrode 127. An exemplary embodiment of the storage electrode is formed by extending a portion of the control electrode 124b downward, turning to the right, and then extending it upward.

Exemplary embodiments of the gate conductors 121 and 124b are made of an aluminum-containing metal such as aluminum (Al) and an aluminum alloy, a silver-containing metal such as silver (Ag) and a silver alloy, a copper-containing metal such as copper (Cu) and copper alloy, a molybdenum-containing metal such as molybdenum (Mo) and a molybdenum alloy, chromium (Cr), tantalum (Ta), titanium (Ti), or other similar substance.

However, alternative exemplary embodiments include configurations where the gate lines 121 and 124b have a multi-layered structure including two conductive layers (not shown) having different physical properties from each other.

The lateral sides of the gate conductors 121 and 124b are inclined relative to a surface of the substrate 110, and exemplary embodiments of the inclination angle may be in a range of about 30° to about 80°.

A gate insulating layer 140 made of a silicon nitride ("SiNx"), a silicon oxide ("SiOx"), or other similar substance is formed on the gate conductors 121 and 124b.

A plurality of first semiconductors 154a and a plurality of second semiconductors 154b, which are made of a hydrogenated amorphous silicon (abbreviated to a-Si) or a polysilicon, are formed on a gate insulating layer 140.

The first semiconductor 154a is disposed on the first control electrode 124a, and the second semiconductor 154b is disposed on the second control electrode 124b.

A plurality pairs of first ohmic contacts 163a and 165a and a plurality pairs of second ohmic contacts 163b and 165b are formed on the first and second semiconductors 154a and 154b, respectively.

The ohmic contacts 163a, 163b, 165a, and 165b are island-shaped and are made of a silicide or an n+ hydrogenated amorphous silicon or other similar substances which are highly doped with n-type impurities such as a phosphorus (P) or other similar substances.

A plurality of data conductors including a plurality of the data lines 171, a plurality of the driving voltage lines 172, and a plurality of first and second output electrodes 175a and 175b are formed on the ohmic contacts 163a, 163b, 165a, and 165b and the gate insulating layer 140.

The data lines 171 extend in a longitudinal direction to intersect the gate lines 121 and transmit the data signals.

Each of the data lines 171 includes an input electrode 173a extending toward the first control electrode 124a and an end portion 179 having a large area to connect to an external driving circuit (not shown) or other layers.

In an exemplary embodiment where a data driving circuit (not shown) for generating the data signals is integrated with the substrate 110, the data lines 171 may extend to directly connect to the data driving circuit.

The driving voltage lines 172 extend in a longitudinal direction, substantially parallel to the data lines 171, to intersect the gate lines 121 and transmit the driving voltages.

Each of the driving voltage lines 172 includes a second input electrode 173b extending toward the second control electrode 124b.

The driving voltage line 172 overlaps with the storage electrode 127.

The first and second output electrodes 175a and 175b are separated from each other, and are also separated from the data lines 171 and the driving voltage lines 172, respectively.

Each pair of the first input electrode 173a and the first output electrode 175a are disposed opposite each other with respect to the first control electrode 124a, and each pair of the second input electrodes 173b and the second output electrodes 175b are disposed opposite each other with respect to a second control electrode 124b.

Exemplary embodiments of the data conductors 171, 172, 175a, and 175b are made of aluminum (Al), molybdenum (Mo), chromium (Cr), or a refractory metal such as tantalum (Ta) and titanium (Ti). Alternative exemplary embodiments include configurations where the data conductors 171, 172, 175a, and 175b may have a multi-layered structure which is constructed with a refractory metal layer (not shown) and a low resistance conductive layer (not shown).

The lateral sides of the data conductors 171, 172, 175a, and 175b may be inclined relative to the surface of the substrate 110, and the inclination angle may be in a range of about 30° to about 80°, similar to those of the gate conductors 121 and 124b.

A passivation layer 180 is formed on the data conductors 171, 172, 175a, and 175b, the exposed portions of the semiconductors 154a and 154b, the exposed portions of the ohmic contacts 163a, 163b, 165a and 165b, and the gate insulating layer 140.

The passivation layer 180 is made of an inorganic material or an organic material or the like. Exemplary embodiments of the inorganic material are silicon nitride ("SiNx") and silicon oxide ("SiOx"), and an exemplary embodiment of the organic material is polyacryl.

Alternative exemplary embodiments include the configuration where the passivation layer 180 includes a double-layered structure of an inorganic layer and an organic layer.

A plurality of contact holes 182 which expose the end portions 179 of the data lines 171 are formed in the passivation layer 180, and a plurality of contact holes 181 which expose the end portions 129 of the gate lines 121 are formed in the passivation layer 180 and the gate insulating layer 140.

In addition, a contact hole 185b which exposes the second output electrode 175b is formed in the passivation layer 180, and a contact hole 185a which simultaneously exposes a lateral side of the first output electrode 175a, a lateral side of the second control electrode 124b, and the substrate disposed therebetween is formed in the passivation layer 180 and the gate insulating layer 140.

A photosensitive layer 361 is formed on the passivation layer 180.

The photosensitive layer 361 has an opening 365 which exposes the contact hole 185b and the second output electrode 175b, an opening 367 which simultaneously exposes the contact hole 185a, the second control electrode 124b, and the first output electrode 175a, and openings 368 and 369 that expose the end portion 129 of the gate line 121 and the end portion 179 of the data line 171.

A portion of the photosensitive layer 361 surrounding the opening 365 is used as a partition wall to be described further below.

The portions of the photosensitive layer 361 disposed on the end portion 129 of the gate line 121 and the end portion 179 of the data lines 171 are thinner than other portions to allow for an easier connection to an external circuit (not shown).

The photosensitive layer 361 may be made of an organic material having thermal resistance and liquid resistance. Exemplary embodiments of the organic material include an acryl resin and a polyimide resin or other similar substance. Exemplary embodiments of the inorganic material include a silicon oxide ("SiOx") and a titanium oxide ("TiOx") or other similar substances. Alternative exemplary embodiments include configurations where the photosensitive layer 361 may have more than two layers.

In addition, the photosensitive layer 361 may be made of a photosensitive material containing a black pigment. In this case, the photosensitive layer 361 serves as a light-blocking member.

The photosensitive layer 361 may be used as a mask to form the contact holes 181, 182, 185a, and 185b in the passivation layer 180 and the gate insulating layer 140.

In the exemplary embodiment where the passivation layer 180 is made of the organic material, the passivation layer 180 and the photosensitive layer 361 may be formed to constitute a single-layered photosensitive organic insulating layer.

The photosensitive organic insulating layer comprising the passivation layer 180 and the photosensitive layer 361 includes a photo-curable material and is disposed in the same manner as if it had been disposed as two separate layers as discussed above.

A plurality of pixel electrodes 191 are formed in the opening 365 which is defined by the photosensitive layer 361.

The pixel electrode 191 contacts the second output electrode 175b and the substrate 110.

The second electrode 175b and the pixel electrode 191 have side contact. Portions of the gate insulating layer 140 disposed under the pixel electrode 191 are removed, so that the pixel electrode 191 and the substrate 110 directly contact each other.

As described above, since portions of the gate insulating layer 140 disposed under the pixel electrode 191 are removed, light transmissivity for a bottom emission type display is increased.

The pixel electrode 191 is separated by a predetermined distance from the boundary of the opening 365. For example, the distance may be about 1 μm to about 5 μm.

As a result, an end portion of the pixel electrode 191 is exposed through the opening 365.

A plurality of connecting members 85 are formed in the opening 367 which is defined by a gap in the photosensitive layer 361.

The connecting member 85 is connected to the second control electrode 124b and the first output electrode 175a through the contact hole 185a.

In this case, the second control electrode 124b and one side of the connecting member 85 have side contact, and the first output electrode 175a and the other side of the connecting member 85 have side contact.

In addition, the connecting member 85 contacts the substrate 110 between the second control electrode 124b and the first output electrode 175a.

The connecting member 85 is separated by a predetermined distance from the boundary of the opening 367. For example, the distance may be about 1 μm to about 5 μm.

As a result, an end portion of the connecting member 85 is exposed through the opening 367.

Contact assistants 81 and 82 are formed in the openings 368 and 369 which are defined by gaps in the photosensitive layer 361.

The contact assistants 81 and 82 are connected to the end portions 129 and 179 of the gate and data lines 121 and 171 through the contact holes 181 and 182, respectively. Therefore, the contact assistants 81 and 82 have a function of enhancing adhesiveness of the end portions 129 and 179 of the gate and data lines 121 and 171 to the external devices and protecting the end portions 129 and 179.

Exemplary embodiments of the pixel electrode 191, the connecting member 85, and the contact assistants 81 and 82 may be made of a transparent conductor such as indium tin oxide ("ITO") and indium zinc oxide ("IZO") or other similar substances. In a top emission type of display, the pixel electrode 191, the connecting member 85, and the contact assistants 81 and 82 may be made of an opaque conductor such as aluminum (Al) and an aluminum alloy, gold (Au), platinum (Pt), nickel (Ni), copper (Cu), and tungsten (W), which all have high work functions.

An insulating member 40 is formed on the connecting member 85.

The insulating member 40 may be made of a silicon nitride ("SiNx") or a silicon oxide ("SiOx") and may entirely cover the connecting member 85 for the protection thereof.

An organic light emitting member 370 is formed in the opening 365 defined by the gap in the photosensitive layer 361.

The organic light emitting member 370 includes an emitting layer (not shown) for emitting light, and may have a multi-layered structure including an auxiliary layer (not shown) for enhancing a light emitting efficiency of the emitting layer.

The emitting layer may be made of an organic material, which emits light of one of primary colors such as red, green, and blue. The emitting layer may include a polyfluorene derivative, a (poly)paraphenylenevinylene derivative, a polyphenylene derivative, a polyfluorene derivative, a polyvinylcarbazole derivative, a polythiophene derivative, or a polymer thereof doped with a perylene-based pigment, a cumarine-based pigment, a rhodamine-based pigment, rubrene, perylene, 9,10-diphenylanthracene, tetraphenylbutadiene, Nile red, coumarin, quinacridone.

A color OLED display displays a desired image by a spatial combination of the primary colors emitted from the emitting layer.

Exemplary embodiments of the auxiliary layers include an electron transport layer (not shown) and a hole transport layer (not shown) which balance electrons and holes, and an electron injecting layer (not shown) and an hole injecting layer (not shown) which enhance injection of the electrons and the holes. The auxiliary layers may include one or more layers selected from the aforementioned layers.

The hole transport layer and the hole injection layer may be made of a material having a work function which is between the work functions of the pixel electrode 191 and the emitting layer. The electron transport layer and the electron injection layer may be made of a material having a work function which is between the work functions of a common electrode 270 and the emitting layer.

Exemplary embodiments of the hole transport layer or the hole injection layer may be made of poly(3,4-ethylenedioxythiophene)-polystyrenesulfonate ("PEDOT:PSS") or other similar substances.

The common electrode 270 is formed on the entire surface comprising the organic light emitting member 370 and the insulating member 40.

The common electrode 270 and the pixel electrode 191 supply current to the organic light emitting member 370.

The insulating member 40 insulates the connecting member 85 from the common electrode 270.

The common electrode 270 may be made of an opaque conductive material which has good electron injection characteristics and does not influence the organic material. Exemplary embodiments of the common electrode 270 may be made of an aluminum-based metal, barium (Ba), or other similar substances.

In addition, in the top emission type display, the common electrode 270 may be made of a transparent or a translucent conductive material. Exemplary embodiments of the common electrode 270 may be a single-layered structure including indium tin oxide ("ITO"), indium zinc oxide ("IZO"), aluminum (Al), and silver (Ag) having a thickness of about 50 to 100 Å, or other similar substances. Alternative exemplary embodiments include configurations where the common electrode 270 may be a multi-layered structure including Ca—Ag, LiF—Al, Ca—Ba, Ca—Ag—ITO, or other similar substances.

In the OLED display, the first control electrode 124a connected to the gate line 121, the first input electrode 173a connected to the data line 171, and the first output electrode 175a together with the first semiconductor 154a constitute the switching thin film transistor (switching TFT) Qs, and the channel thereof is formed in the first semiconductor 154a between the first input electrode 173a and the first output electrode 175a.

The second control electrode 124b connected to the first output electrode 175a, the second input electrode 173b connected to the driving voltage line 172, and the second output electrode 175b connected to the pixel electrode 171 together with the second semiconductor 154b constitute the driving thin film transistor (driving TFT) Qd, and the channel thereof is formed in the second semiconductor 154b between the second input electrode 173b and the second output electrode 175b.

In the present exemplary embodiment, a single switching TFT and a single driving TFT are employed. However, alternative exemplary embodiments include configurations where at least one TFT and a plurality of wire lines for driving the TFTs may be further included. Accordingly, even when the OLED and the driving transistor Qd are driven for long periods of time, deterioration in the performance of the OLED and the driving transistor Qd may be prevented, reduced or compensated for, so that a lifetime of the OLED display is prevented from being shortened. The additional TFT and the wire can compensate for the changes of the threshold voltage depending on time. Thus, depending on the time, deterioration of the driving transistor Qd and the OLED can be prevented.

The pixel electrode 191, the organic light emitting member 370, and the common electrode 270 constitute the OLED LD. The pixel electrode 191 may serve as the anode, and the common electrode 270 may serve as the cathode in the top emission type display. On the contrary, in the bottom emission type display the pixel electrode 191 may serve as the cathode, and the common electrode 270 may serve as the anode.

The storage electrode 127 and the driving voltage line 172 overlapping each other constitute the storage capacitor Cst.

In the exemplary embodiment where the semiconductors 154a and 154b are made of a polysilicon, the semiconductors 154a and 154b include an intrinsic region (not shown) facing the control electrodes 124a and 124b and an extrinsic region disposed at both sides of the intrinsic region.

In such an exemplary embodiment the extrinsic region is electrically connected to the input electrode 173a and 173b and the output electrodes 175a and 175b, and the ohmic contacts 163a, 163b, 165a, and 165b may be omitted.

In another exemplary embodiment, the control electrodes 124a and 124b may be disposed on the semiconductors 154a and 154b. In this exemplary embodiment, the gate insulating layer 140 is also disposed between the semiconductors 154a and 154b and the control electrodes 124a and 124b.

The data conductors 171, 172, 173a, 173b, 175b and 175b are disposed on the gate insulating layer 140 and are electrically connected to the semiconductors 154a and 154b through contact holes (not shown) formed in the gate insulating layer 140.

In yet another exemplary embodiment, the data conductors 171, 172, 173a, 173b, 175a and 175b may be disposed under the semiconductors 154a and 154b to be electrically connected to the semiconductors 154a and 154b disposed thereon.

Now, a method of manufacturing the OLED display shown in FIGS. 2 and 3 will be described in detail with reference to FIGS. 4 to 15.

Figure 4:
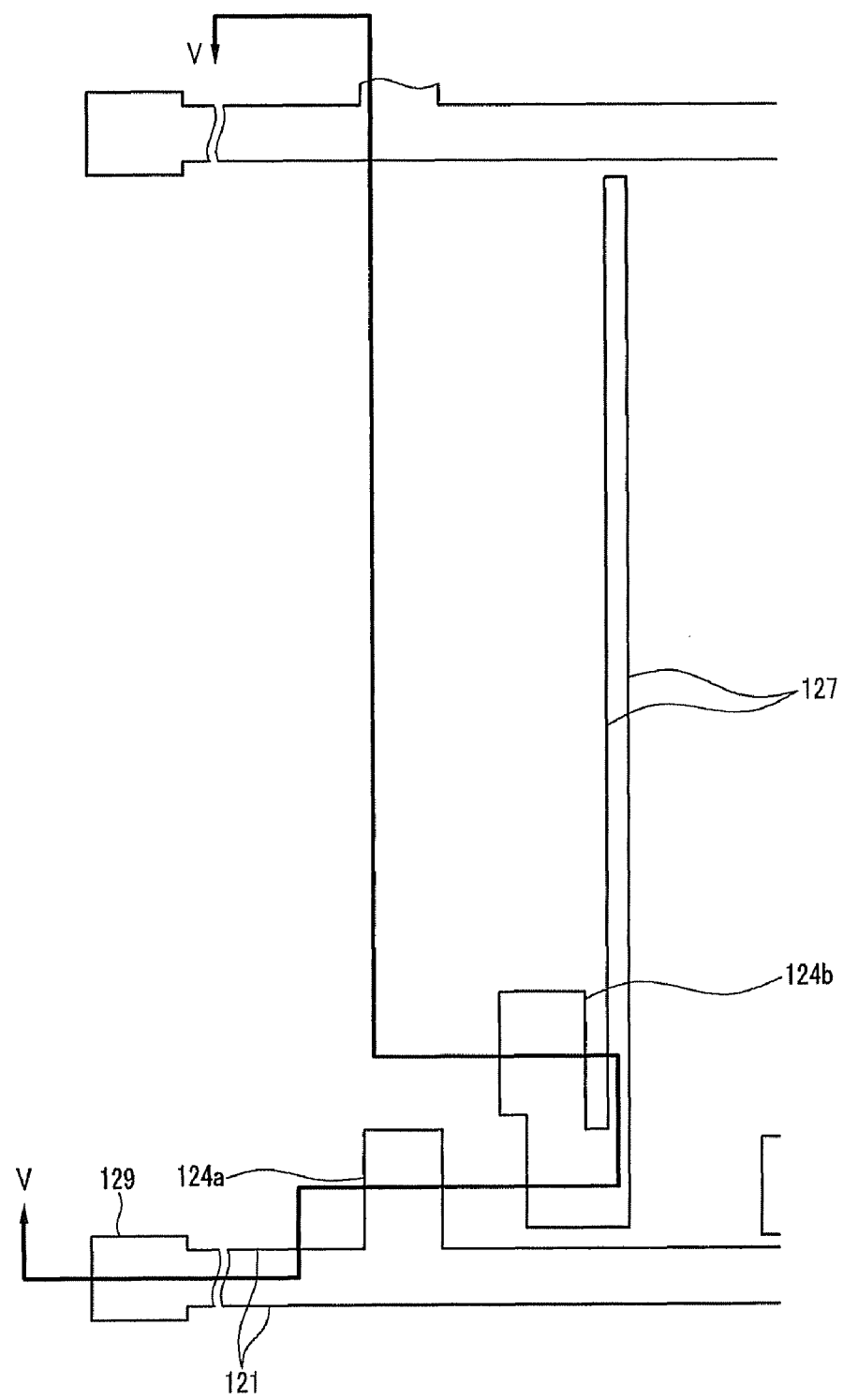
FIGS. 4, 6, 8, 10, 12, and 14 are top plan views showing an exemplary embodiment of a method of manufacturing the exemplary embodiment of an OLED display shown in FIGS. 2 and 3 according to the present invention.
Figure 5:
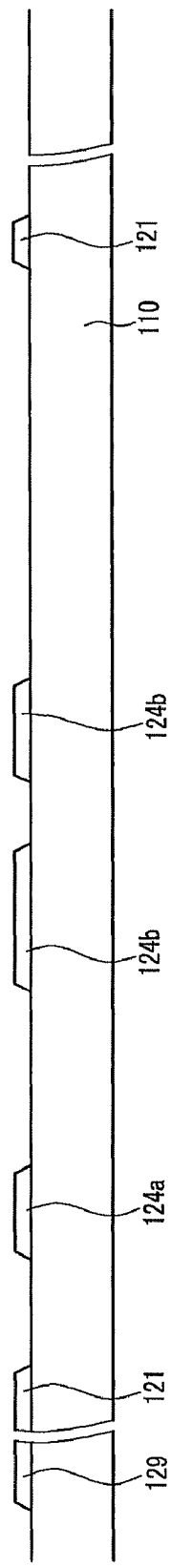
FIG. 5 is a cross-sectional view of the exemplary embodiment of an OLED display taken along line V-V of FIG. 4.
Figure 6:
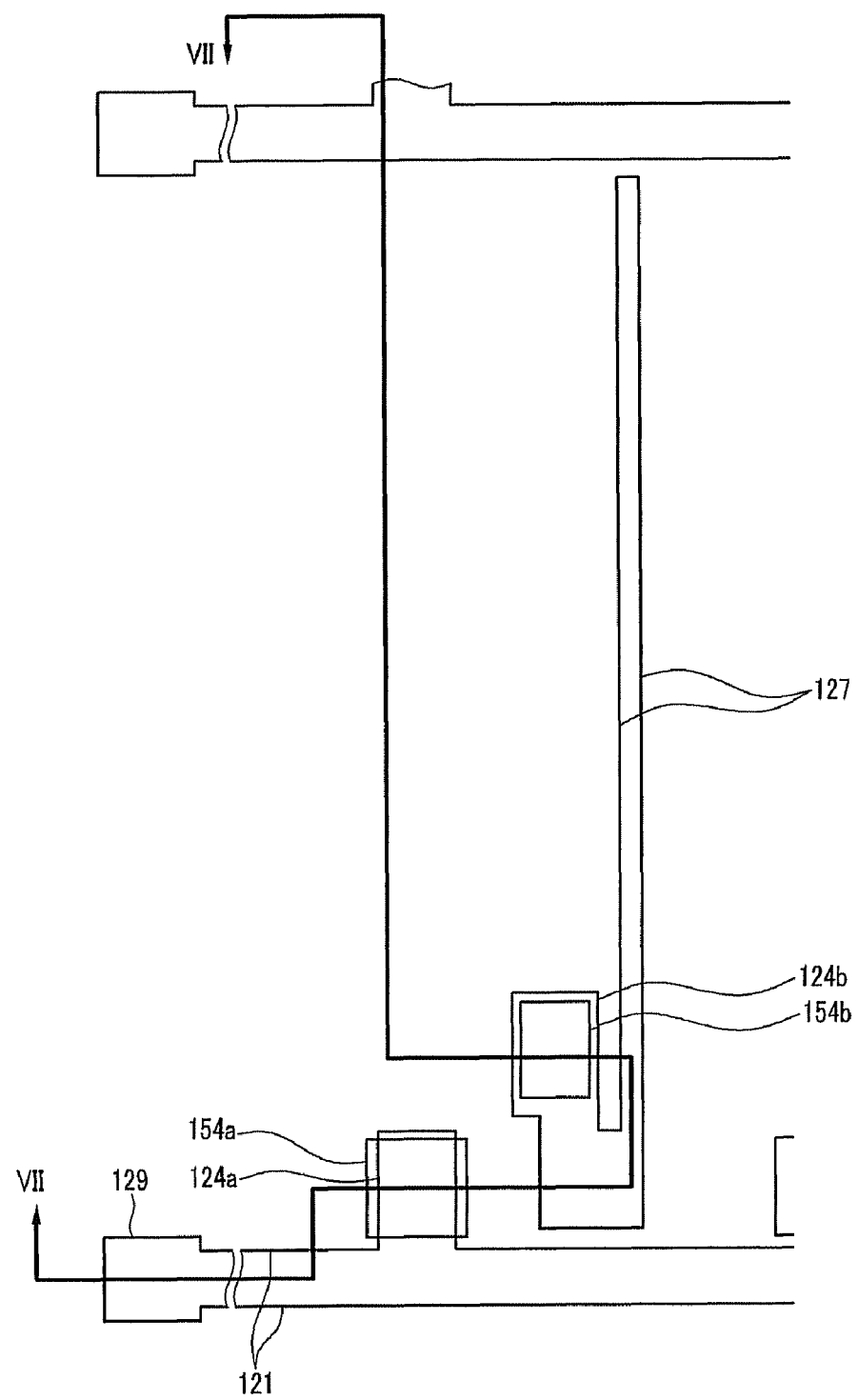
Figure 7:
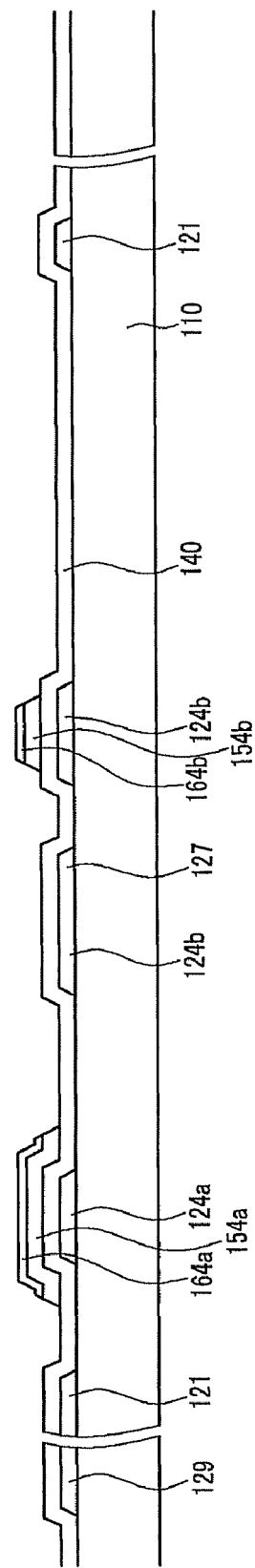
FIG. 7 is a cross-sectional view of the exemplary embodiment of an OLED display taken along line VII-VII of FIG. 6.
Figure 8:
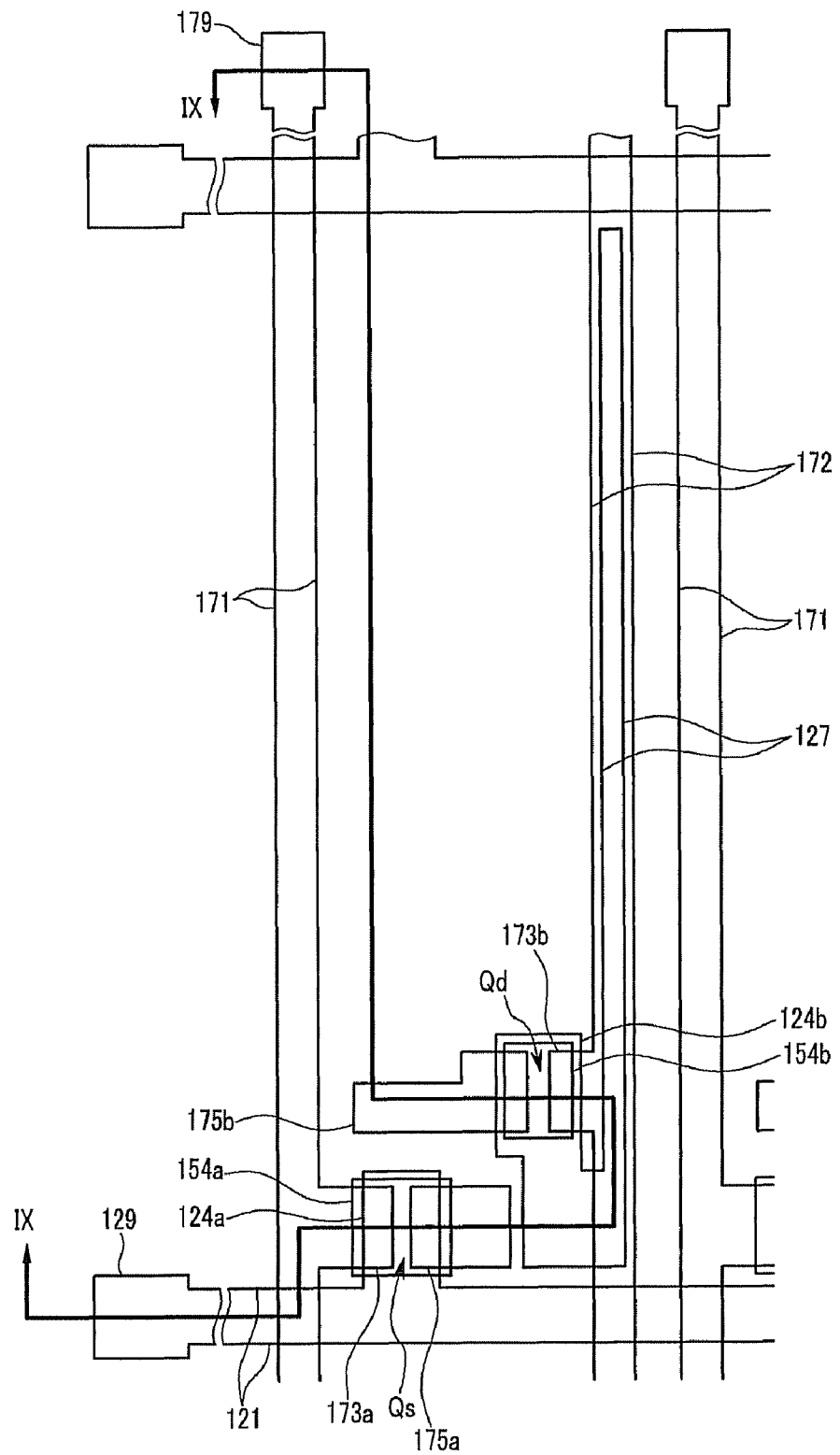
Figure 9:
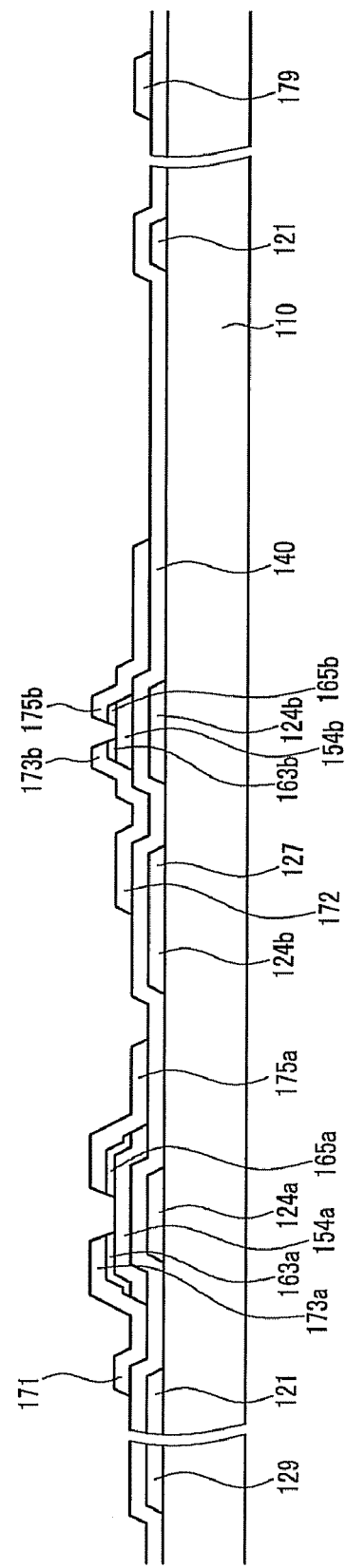
FIG. 9 is a cross-sectional view of the exemplary embodiment of an OLED display taken along line IX-IX of FIG. 8.
Figure 10:
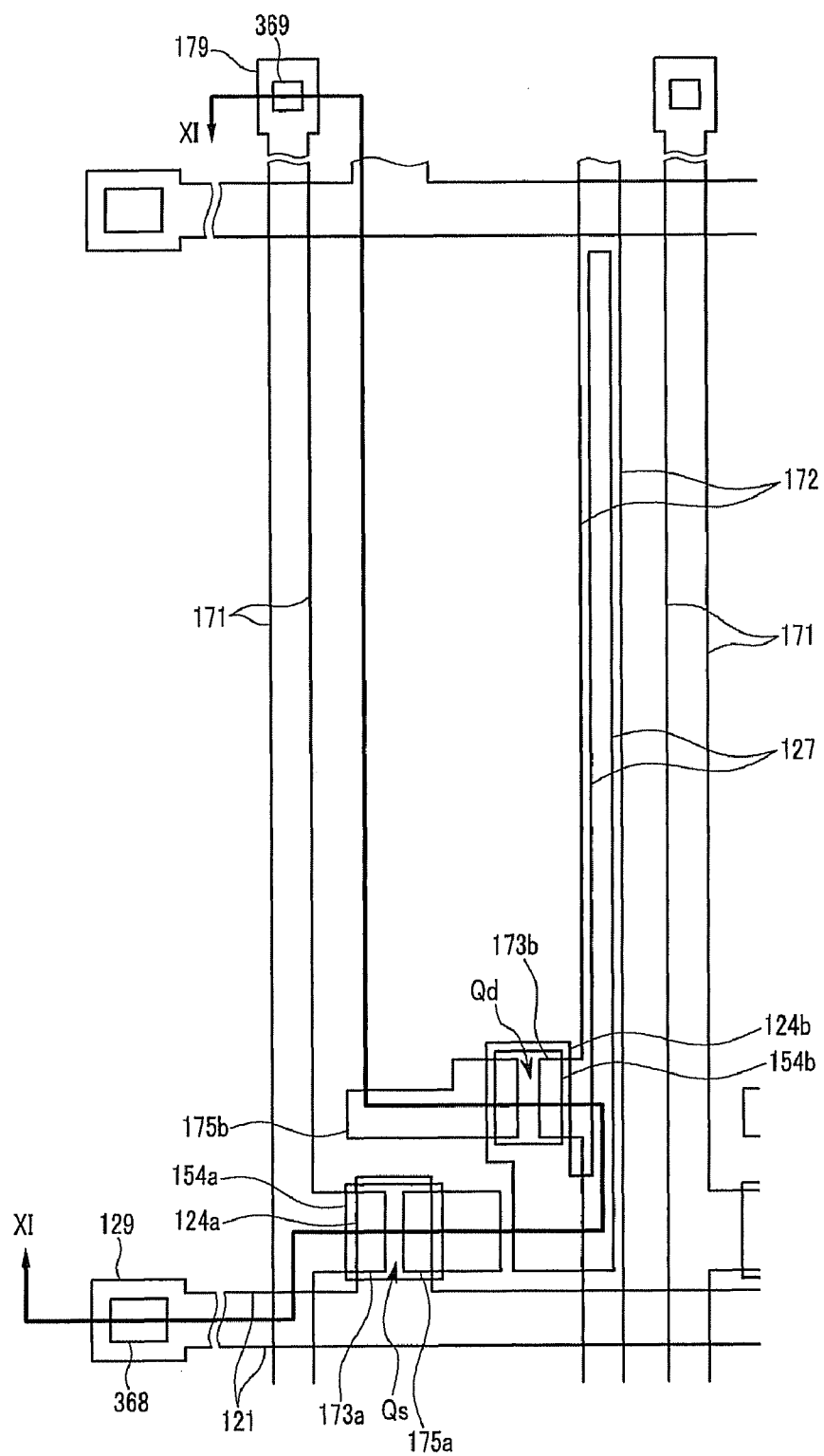
Figure 11:
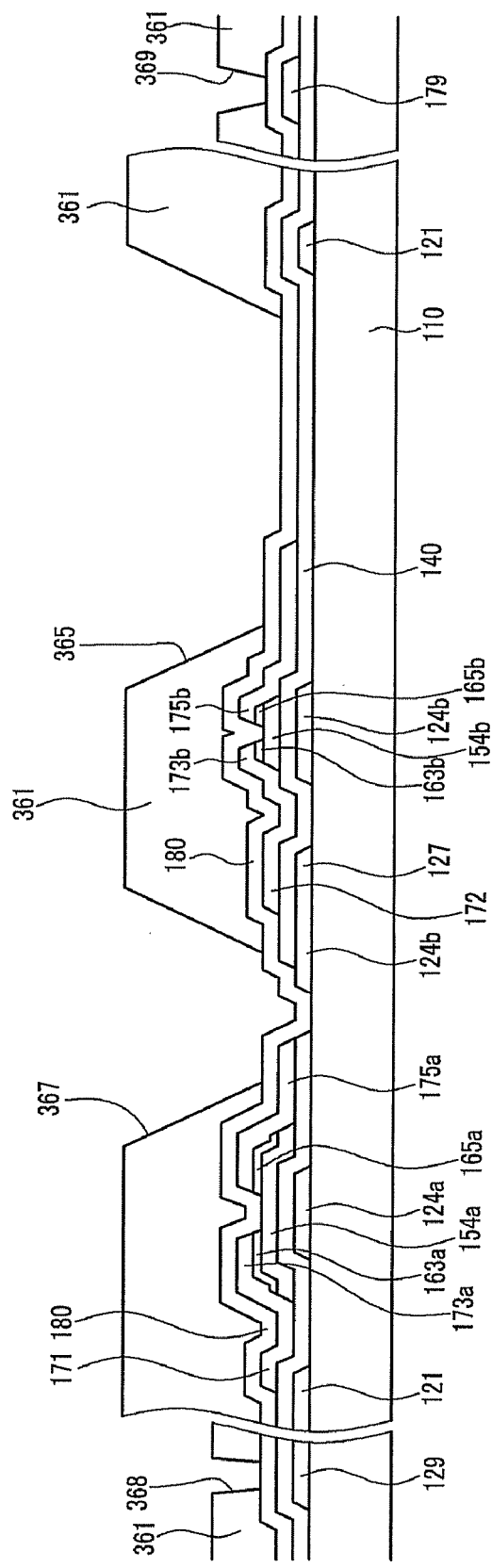
FIG. 11 is a cross-sectional view of the exemplary embodiment of an OLED display taken along line XI-XI of FIG. 10.
Figure 12:
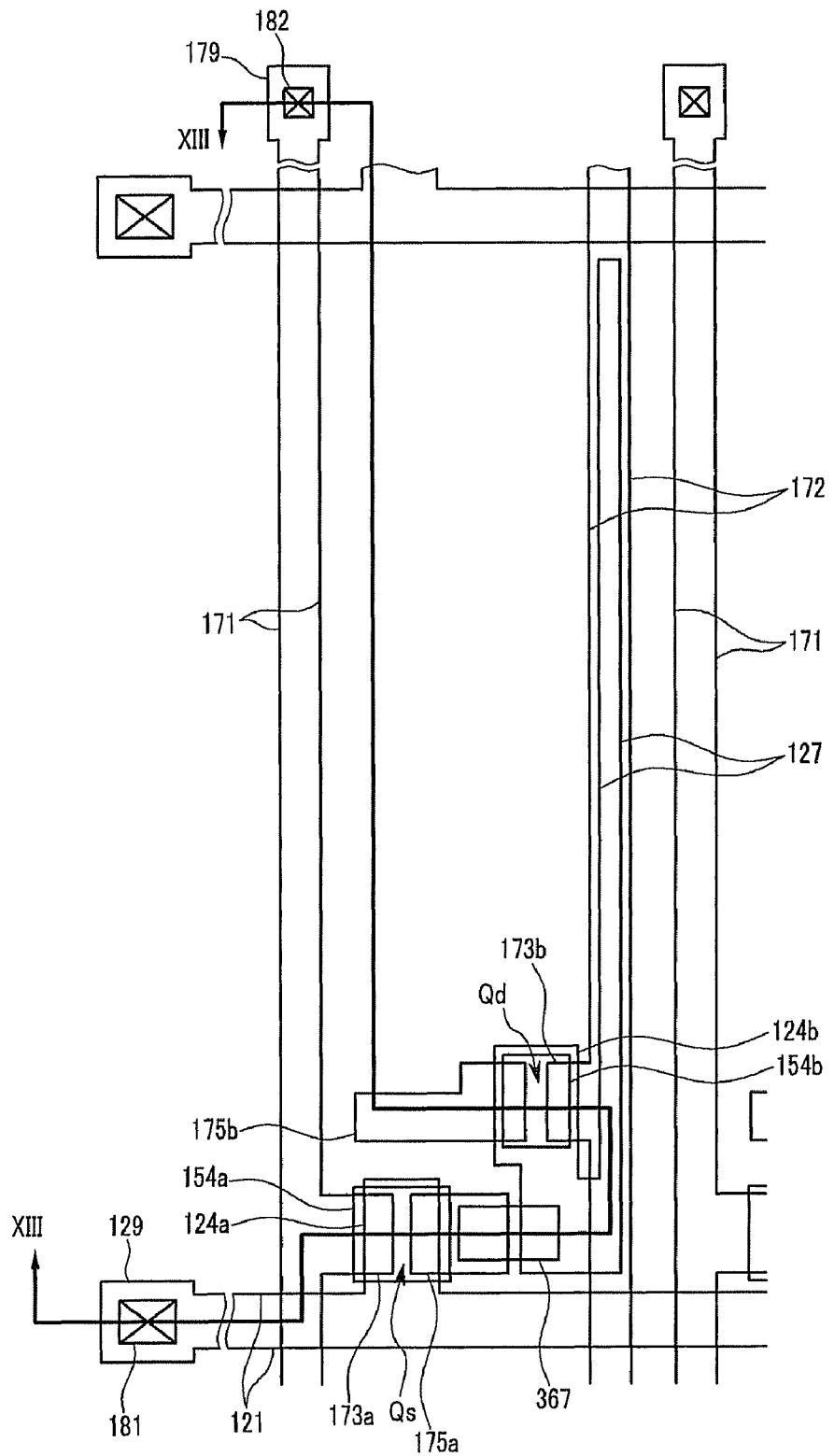
Figure 13:
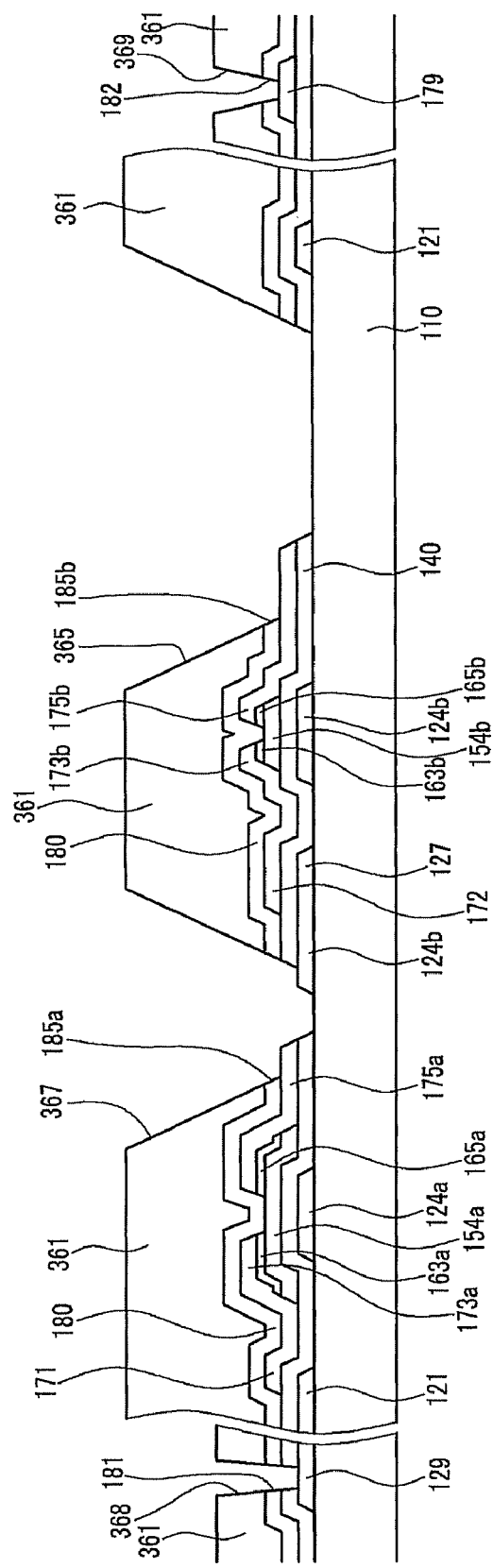
FIG. 13 is a cross-sectional view of the exemplary embodiment of an OLED display taken along line XIII-XIII of FIG. 12.
Figure 14:
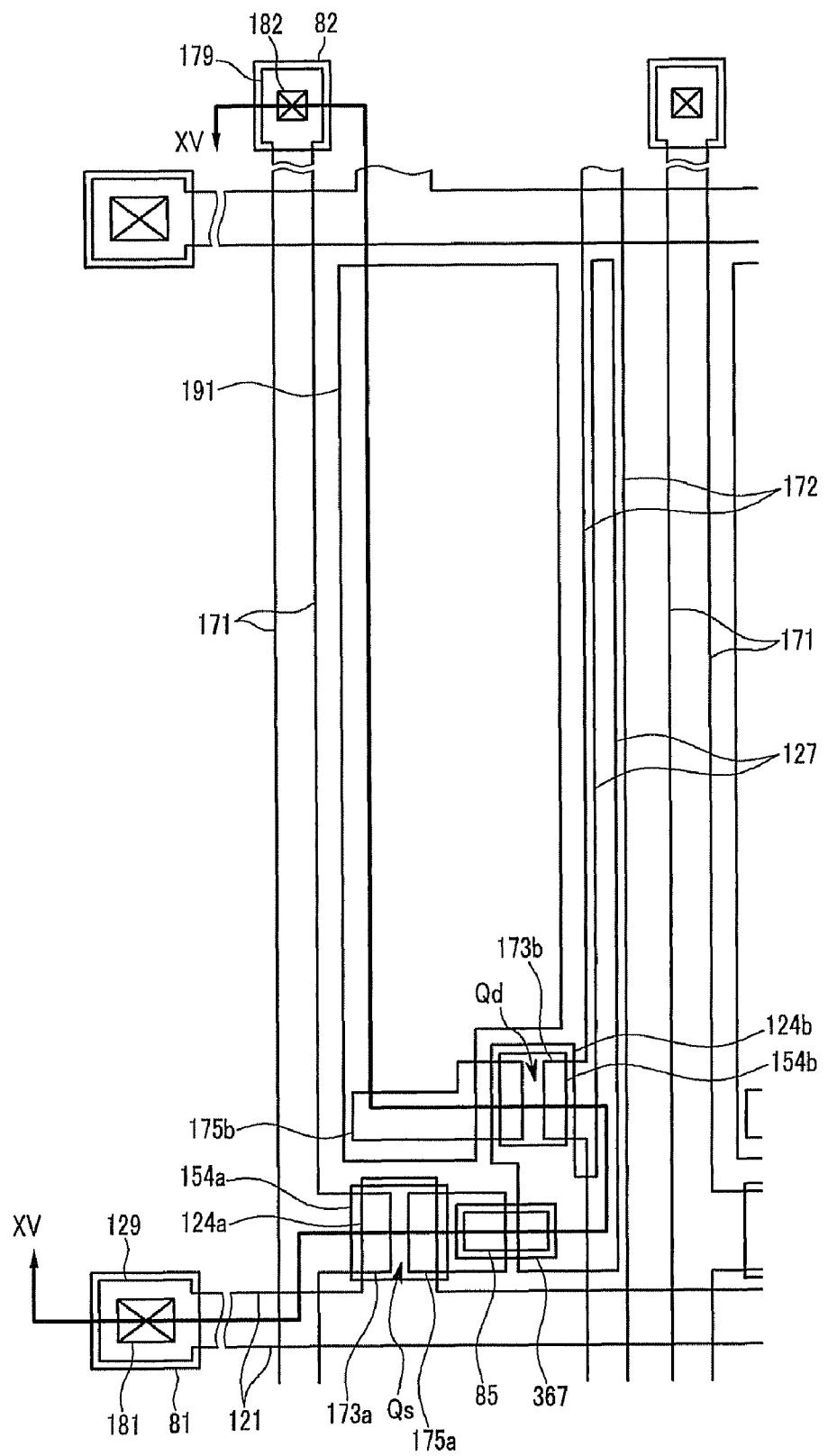
Figure 15:
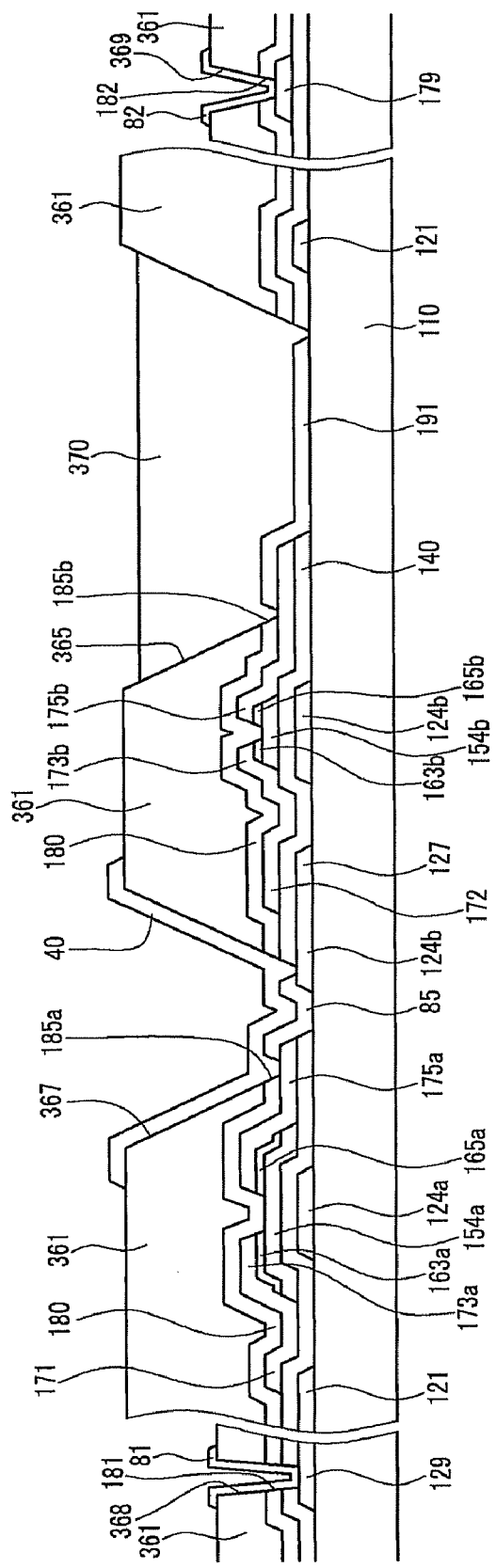
FIG. 15 is a cross-sectional view of the exemplary embodiment of an OLED display taken along line XV-XV of FIG. 14.

FIGS. 4, 6, 8, 10, 12, and 14 are top plan views showing an exemplary embodiment of a method of manufacturing the exemplary embodiment of an OLED display shown in FIGS. 2 and 3 according to the present invention, FIG. 5 is a cross-sectional view of the exemplary embodiment of an OLED display taken along line V-V of FIG. 4, FIG. 7 is a cross-sectional view of the exemplary embodiment of an OLED display taken along line VII-VII of FIG. 6, FIG. 9 is a cross-sectional view of the exemplary embodiment of an OLED display taken along line IX-IX of FIG. 8, FIG. 11 is a cross-sectional view of the exemplary embodiment of an OLED display taken along line XI-XI of FIG. 10, FIG. 13 is a cross-sectional view of the exemplary embodiment of an OLED display taken along line XIII-XIII of FIG. 12, and FIG. 15 is a cross-sectional view of the exemplary embodiment of an OLED display taken along line XV-XV of FIG. 14.

Referring to FIGS. 4 and 5, a plurality of gate conductors are formed on a substrate 110. The plurality of gate conductors include a plurality of gate lines 121 which include first control electrodes 124a and end portions 129, and a plurality of second control electrodes 124b which include storage electrodes 127.

Next, referring to FIGS. 6 and 7, a gate insulating layer 140, an intrinsic a-Si layer, and an extrinsic a-Si layer are sequentially deposited on the gate conductor and the substrate, and the extrinsic a-Si layer and the intrinsic a-Si layer are patterned by a lithography and etching process to form a plurality of extrinsic semiconductors 164a and 164b and a plurality of first and second semiconductors 154a and 154b.

Next, although not shown in FIGS. 6 and 7, data conductors are formed. The data conductors include a plurality of data lines 171 which include first input electrodes 173a and end portions 179, driving voltage lines 172 which include second input electrodes 173a, and a plurality of first and second output electrodes 175a and 175b.

Next, referring to FIGS. 8 and 9, when exposed portions of the extrinsic semiconductors 164a and 164b which are not covered with the data conductors 171, 172, 175a, and 175b are removed, ohmic contacts 163a, 165a, 163b, and 165b are formed, and portions of the first and second semiconductors 154a and 154b which are disposed under the extrinsic semiconductors 164a and 164b are exposed.

Next, referring to FIGS. 10 and 11, a passivation layer 180 is deposited on the entire surface of the substrate 110. In one exemplary embodiment the passivation layer 180 is deposited by a chemical vapor deposition ("CVD") process or another similar process.

Next, a photosensitive organic layer is coated on the passivation layer 180 by using a spin coating process or another similar process, and a photosensitive layer 361 is formed to have openings 365, 367, 368, and 369 by performing exposing and developing processes on the photosensitive organic layer.

Here, the photosensitive layer 361 located on the end portions 129 and 179 of the gate line 121 and the data line 171, respectively, are formed to be thin by performing a slit process.

Next, referring to FIGS. 12 and 13, a plurality of contact holes 181, 182, 185a, and 185b are formed by etching the passivation layer 180 and the gate insulating layer 140 by using the photosensitive layer 361 as a mask.

Here, the photosensitive layer 361 is cured, so that portions thereof are used as partition walls.

As described above, in the present exemplary embodiment, after the passivation layer 180 is formed, the photosensitive layer 361 used as the partition walls is formed to pattern the passivation layer 180 by using the photosensitive layer 361 as the mask. As a result, the photolithography process to form the contact holes 181, 182, 185a, and 185b in the passivation layer 180 may be omitted, thereby reducing the number of masks required in the manufacture of the display and simplifying the manufacturing processes.

In the present exemplary embodiment, the passivation layer 180 and the photosensitive layer 361 are formed in separate processes. However, in an alternative exemplary embodiment where the passivation layer 180 is made of an organic material, the passivation layer 180 and the photosensitive layer 361 may be formed to constitute a single-layered photosensitive organic insulating layer.

In such an alternative exemplary embodiment, the photosensitive organic insulating layer is coated on the data conductors 171, 172, 175a, and 175b, the exposed portions of the semiconductors 154a and 154b, and the gate insulating layer 140. Then, the openings 365, 367, 368, and 369 are formed in the photosensitive organic layer by performing the exposing and developing processes at one time.

Therefore, depositing and etching processes on the passivation layer 180 may be omitted, so that it is possible to simplify the manufacturing processes.

Next, after indium tin oxide ("ITO") is deposited on the photosensitive layer 361 and the substrate 110 and is patterned, a plurality of pixel electrodes 191, a plurality of connecting members 85, and a plurality of contact assistants 81 and 82 are formed.

Next, a shadow mask (not shown) having a predetermined opening portion is placed above the substrate 110, and an insulating material such as a silicon nitride ("SiNx") or the like is deposited.

Here, the opening portion of the shadow mask is placed above the opening 367 which exposes the connecting member 85, so that an insulating member 40 may be formed only on the opening 367.

Next, referring to FIGS. 14 and 15, a light emitting member 370 including a hole transport layer (now shown) and an emitting layer (now shown) are formed in the opening 365.

The light emitting member 370 may be formed by a solution process such as an inkjet printing process or a deposition. The present exemplary embodiment uses the inkjet printing process. In the inkjet printing process, an ink is dropped into the opening 365 by moving an inkjet head (not shown) across the display. In this case, after each layer is formed, a drying process is performed.

As described above, the boundary of the opening 365 which defines the light emitting member 370 is formed beyond the pixel electrode 191. Therefore, in the case where the light emitting member 370 is formed by using the inkjet printing process, the light emitting member 370 fluidly fills the boundaries of the opening 365. The light emitting member 370 can thus be formed to be uniformly adhesive to the pixel electrode 191. Accordingly, it is possible to increase light emitting efficiency because the light emitting member 370 makes contact throughout the pixel electrode.

Next, referring to FIGS. 2 and 3, a common electrode 270 is formed on the photosensitive layer 361 and the light emitting member 370.

As described above, the photosensitive layer 361 used as the partition walls serves as the mask to etch the lower layers thereof, so that it is possible to reduce the number of masks and to simplify the manufacturing processes.

In addition, the passivation layer 180 is not formed under the pixel electrode 191, so that it is possible to increase light transmissivity in a bottom emission type display by preventing the passivation layer 180 from absorbing, scattering or reflecting the light from the light emitting member 370.

Now, a structure of another exemplary embodiment of an OLED display according to the present invention will be described in detail with reference to FIGS. 1, 16, and 17.

Like reference numerals denote like elements, and descriptions of previously-described components are omitted.

Figure 16:
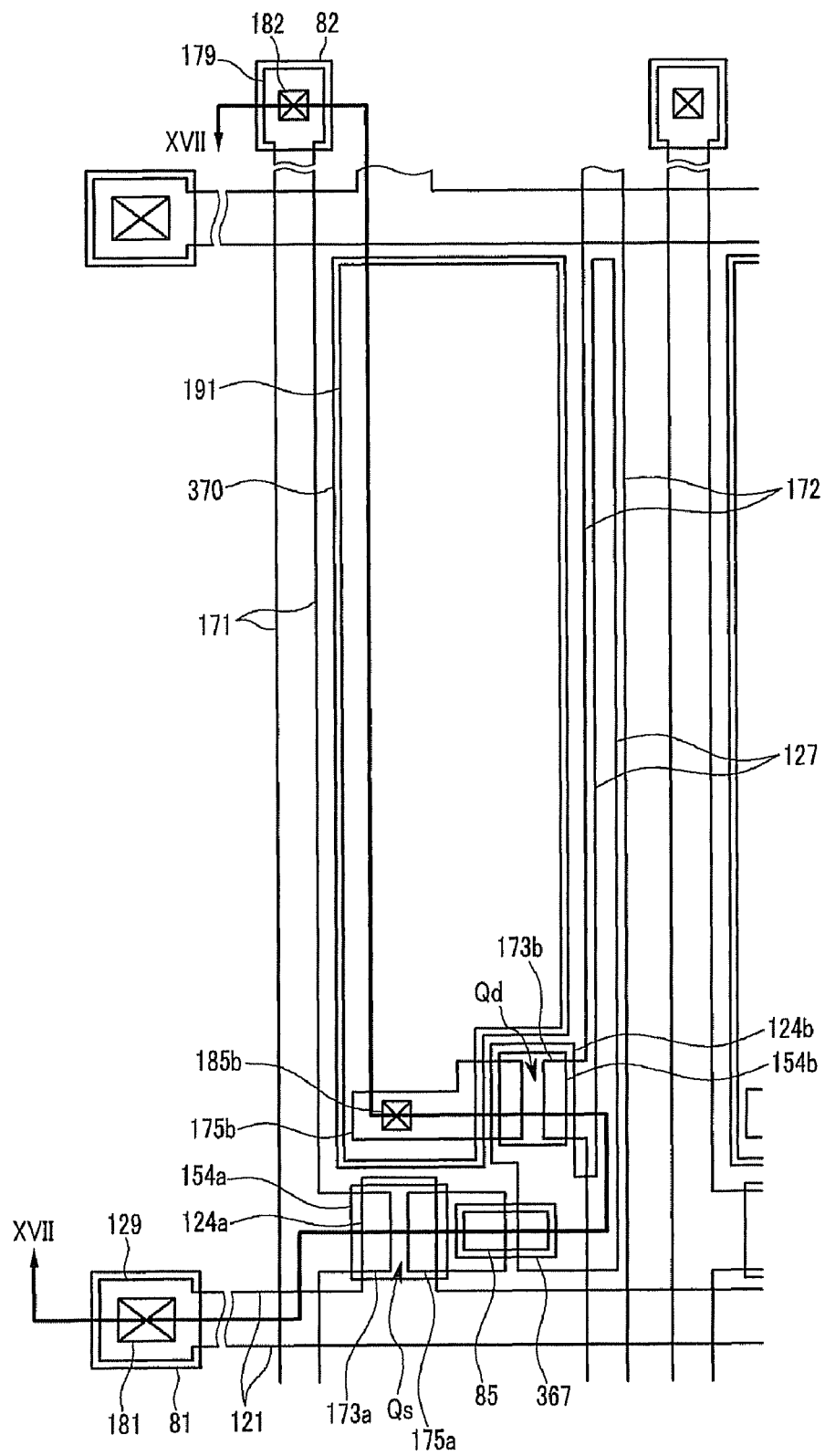
FIG. 16 is a top plan layout view of another exemplary embodiment of a pixel in an OLED display according to the present invention.
Figure 17:
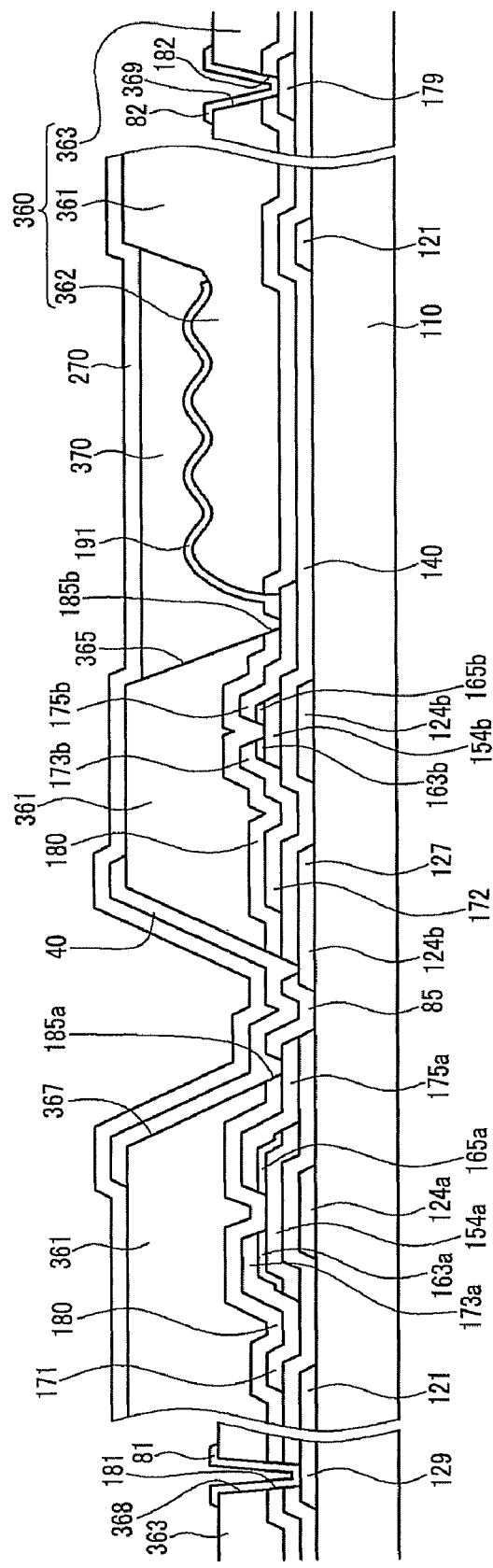
FIG. 17 is a cross-sectional view of the exemplary embodiment of an OLED display taken along line XVII-XVII of FIG. 16.

FIG. 16 is a top plan layout view of another exemplary embodiment of an OLED display according to the present invention, and FIG. 17 is a cross-sectional view of the exemplary embodiment of an OLED display taken along line XVII-XVII of FIG. 16.

A plurality of gate conductors including a plurality of second control electrodes 124b and a plurality of gate lines 121 having first control electrodes 124a are formed on an insulating layer 110.

A gate insulating layer 140 made of a silicon nitride ("SiNx") or a silicon oxide ("SiOx") or another similar substance is formed on the gate conductors 121 and 124b.

A plurality of first and second semiconductors 154a and 154b, which are made of hydrogenated amorphous silicon (a-Si) or polysilicon, are formed on the gate insulating layer 140.

The first semiconductor 154a is disposed on the first control electrode 124a, and the second semiconductor 154b is disposed on the second control electrode 124b.

A plurality of pairs of first ohmic contacts 163a and 165a and a plurality of pairs of second ohmic contacts 163b and 165b are formed on the first and second semiconductors 154a and 154b, respectively.

A plurality of data conductors including a plurality of the data lines 171, a plurality of the driving voltage lines 172, and a plurality of first and second output electrodes 175a and 175b are formed on the ohmic contacts 163a, 163b, 165a, and 165b and the gate insulating layer 140

A passivation layer 180 is formed on the data conductors 171, 172, 175a, and 175b, exposed portions of the semiconductors 154a and 154b, exposed portions of the ohmic contacts 163a, 163b, 165a and 165b and the gate insulating layer 140.

A plurality of contact holes 182 and 185b which expose an end portion 179 of the data line 171 and the second output electrode 175b are formed on the passivation layer 180.

In addition, a contact hole 181 which exposes an end portion 129 of the gate line 121 and a contact hole 185a which simultaneously exposes the first output electrode 175a and the second control electrode 124b are formed in the passivation layer 180 and the gate insulating layer 140.

An insulating layer 360 is formed on the passivation layer 180. The insulating layer 360 includes a first portion 361 and second and third portions 362 and 363, respectively, which are both thinner than the first portion 361.

The first portion 361 includes partition walls for defining a light emitting material therein, and has an opening 367 which simultaneously exposes the second control electrode 124b and the first output electrode 175a.

The second portion 362 is surrounded by the first portion 361 and is thinner than the first portion 361. The surface of the second portion 362 has an uneven shape in which concave and convex portions are alternately arrayed.

In addition, the contact hole 185b is exposed between the first and second portions 361 and 362, and the second output electrode 175b is exposed therethrough.

The third portion 363 has openings 368 and 369 which expose the end portions 129 and 179 of the gate line and data line 121 and 171, respectively. The third portion 363 is thinner than the first portion 361 to easily connect to an external circuit.

The insulating layer 360 may be made of a photosensitive organic insulating material having thermal and solvent resistance. Exemplary embodiments of such a photosensitive organic insulating material include an acrylic resin and a polyimide resin or other similar substances. Exemplary embodiments of the insulating layer 360 may also include an inorganic material such as a silicon oxide ("SiOx") and a titanium oxide ("TiOx") or other similar substances. Alternative exemplary embodiments also include configurations where the insulating layer 360 may be constructed with two or more layers.

In addition, the insulating layer 360 may be made of a photosensitive material containing a black pigment. In this case, the insulating layer 360 serves as a light-blocking member.

The first, second, and third portions 361, 362, and 363 of the insulating layer 360 may serve as a photosensitive layer to be used as a mask to form the contact holes 181, 182, 185a, and 185b in the passivation layer 180 and the gate insulating layer 140 disposed under the insulating layer 360.

A plurality of pixel electrodes 191 are formed on the second portion 362 of the insulating layer 360.

The pixel electrodes 191 are connected to the second output electrode 175b through the contact hole 185b, and a surface of the pixel electrode has a shape embossed on the insulating layer 360 to match the concave-convex shape of the second portion 362.

As described above, in a case where the pixel electrodes 191 have the embossed shape, a surface area thereof increases. Therefore, an emission area also increases.

Accordingly, as compared with a flat structure, the embossed structure has a larger emission area in terms of the same aperture ratio.

For further explanation, examples are provided with reference to FIGS. 30A to 30E.

Figure 30A:
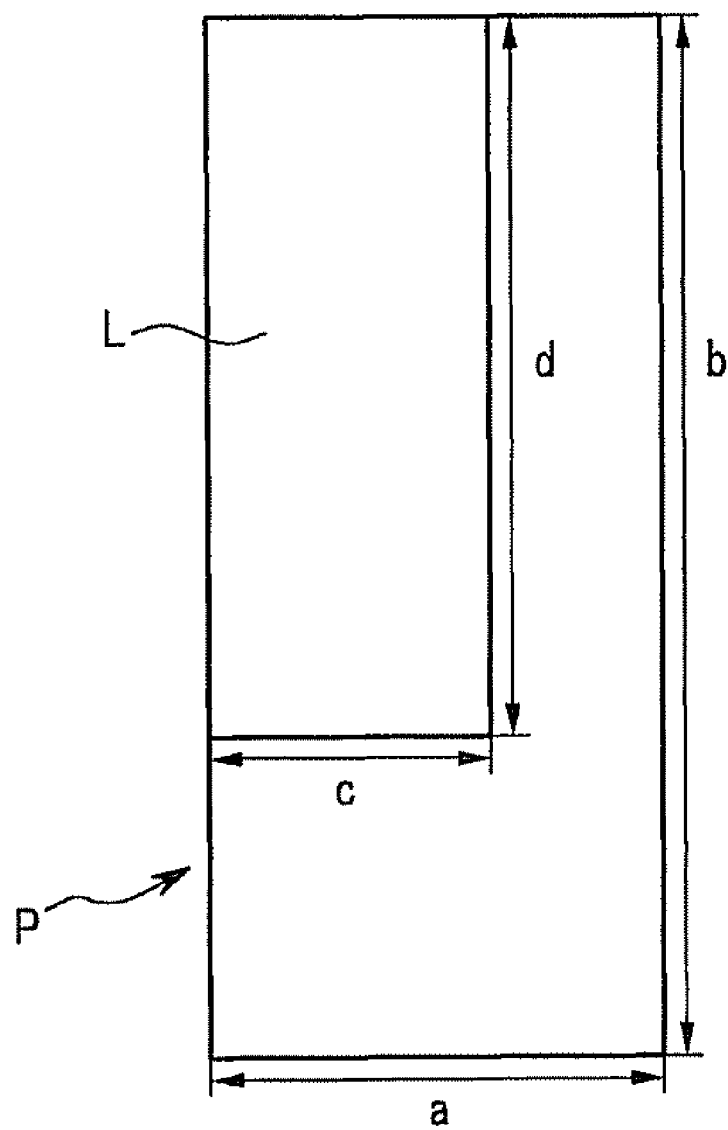
FIG. 30A is a schematic view showing an exemplary embodiment of a pixel electrode of which a surface is flat.
Figure 30B:
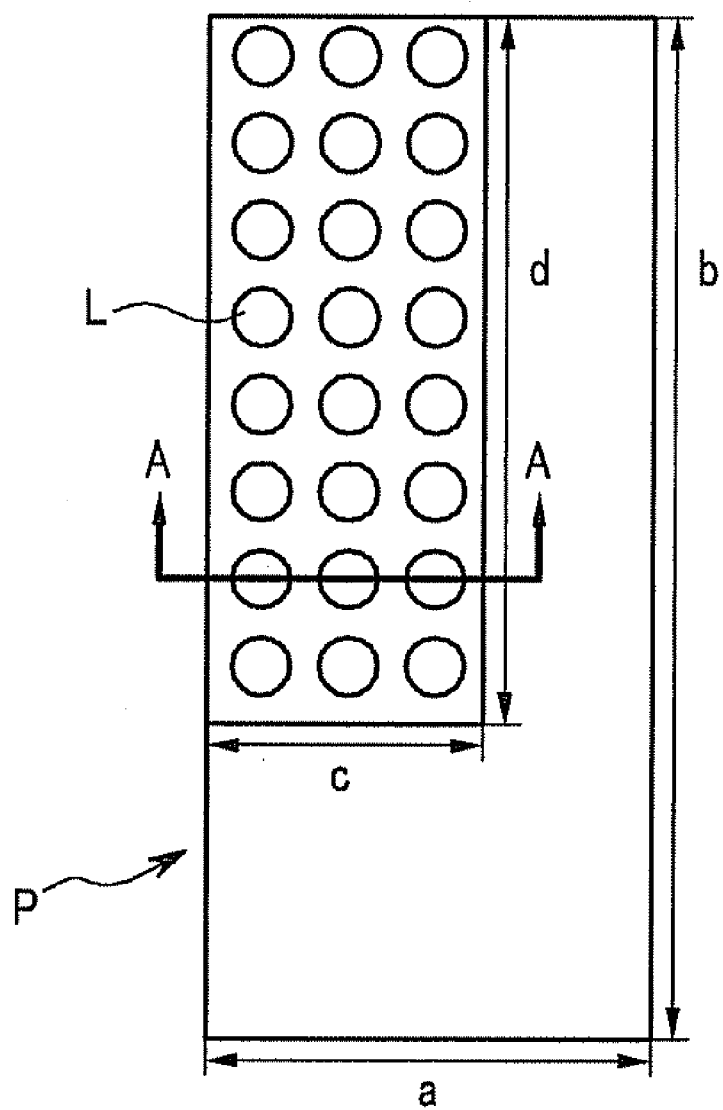
FIG. 30B is a schematic view showing an exemplary embodiment of a pixel electrode of which a surface thereof has an embossed structure.
Figure 30C:
FIG. 30C is a cross-sectional view of the exemplary embodiment of a pixel electrode taken along line A-A of FIG. 30B.
Figure 30D:
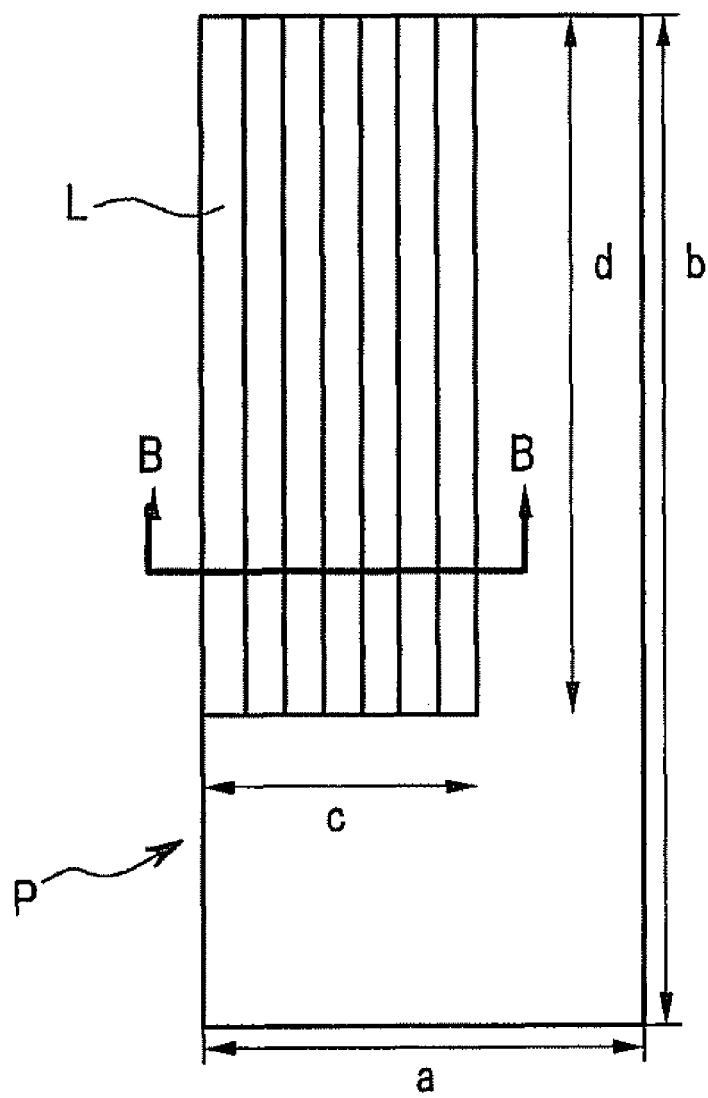
FIG. 30D is a schematic view showing an exemplary embodiment of a pixel electrode of which a surface thereof has a rippled structure.
Figure 30E:
FIG. 30E is a cross-sectional view of the exemplary embodiment of a pixel electrode taken along line B-B of FIG. 30D.

FIG. 30A is a schematic view showing an exemplary embodiment of a pixel electrode of which a surface is flat, FIG. 30B is a schematic view showing an exemplary embodiment of a pixel electrode of which the surface has an embossed structure, FIG. 30C is a cross-sectional view of the exemplary embodiment of a pixel electrode taken along line A-A of FIG. 30B, FIG. 30D is a schematic view showing an exemplary embodiment of a pixel electrode of which the surface has a rippled structure, and FIG. 30E is a cross-sectional view of the exemplary embodiment of a pixel electrode taken along line B-B of FIG. 30D.

In FIGS. 30A to 30D, P denotes a unit pixel and L denotes an emission region of the unit pixel.

Here, the unit pixel has an area of a*b, and the emission region has an area of c*d. Hereinafter, for the convenience of calculation, the lengths a, b, c, and d are assumed to be 100, 300, 60, and 200, respectively. However, these lengths are not meant to limit the present invention but are provided to clarify the principle of increased contact area between the pixel electrode 191 and the organic light emitting member 370.

Referring to FIG. 30A, the surface of the unit pixel 191 is flat. For example, one unit pixel has an area of 100*300=30,000, and the emission region of the unit pixel has an area of 60*200=12,000. For a flat surface, the emission area has the same surface area as that of the emission region, and a ratio of surface area of the emission region to the surface area of the unit pixel is 12,000/30,000=40%.

On the other hand, referring to FIG. 30B, the surface of the unit pixel 191 has the embossed structure. For example, a radius of the embossed hemisphere formed in the emission region L is assumed to be 10, and 30 individual hemispheres are formed within the emission region L.

In this case, the surface area ($2\pi r^2$) of the hemisphere of the embossed ball is $200\pi$, so that a total surface area of the emission region L is $30*(400-10^2\pi+200\pi)=12,000+3,000\pi$.

Therefore, the emission area increases by about $3,000\pi$ compared to that in the flat structure, so that the ratio of the emission region to the pixel increases up to $(12,000+3,000\pi)/30,000\approx71\%$.

Similarly, referring to FIG. 30D, the surface of the unit pixel 191 has a rippled structure. For example, in the rippled structure, upward and downward half cylinders with radiuses of 5 are alternately arrayed. In this case, the circumference ($\pi r$) of the half cylinder is $5\pi$, and 6 half cylinders can be formed, so that a total surface area of the rippled structure is $6*5\pi*200=6,000\pi$.

Therefore, the ratio of the emission region to the pixel is $6,000\pi/30,000\approx62.8\%$.

The previous explanation is for a better understanding of the principles involved, the embossed and rippled structures are exemplified but they do not limit the present invention as various uneven structures which are capable of increasing the surface area may be employed to obtain the same results.

As described above, the embossed structure of the pixel electrode 191 has a large emission surface area as compared with a flat structure in terms of the same aperture ratio.

Referring again to FIGS. 16 and 17, a plurality of connecting members 85 are formed in the openings 367 of the first portions 361.

The connecting members 85 are connected to the second control electrode 124b and the first output electrode 175a through the contact hole 185a.

In this exemplary embodiment the second control electrode 124b and one side of the connecting member 85 have side contact, and the first output electrode 175a and the other side of the connecting member 85 have side contact.

In addition, the connecting member 85 contacts the substrate 110 between the second control electrode 124b and the first output electrode 175a.

The connecting member 85 is separated by a predetermined distance from the boundary of the opening 367. For example, the distance may be about 1 to 5 μm.

As a result, an end portion of the connecting member 85 is exposed through the opening 367.

Contact assistants 81 and 82 are formed in the openings 368 and 369 of the third portion 363.

The pixel electrode 191, the connecting member 85, and the contact assistants 81 and 82 may be made of a transparent conductor such as ITO and IZO or another similar substance. In a top emission type display, the pixel electrode 191, the connecting member 85, and the contact assistants 81 and 82 may be made of an opaque conductor such as aluminum (Al) and an aluminum alloy, gold (Au), platinum (Pt), nickel (Ni), copper (Cu), and tungsten (W), which have high work functions.

An insulating member 40 is formed on the connecting member 85.

The insulating member 40 may be made of a silicon nitride ("SiNx") or a silicon oxide ("SiOx") and to entirely cover the connecting member 85 for the protection thereof.

An organic light emitting member 370 is formed on the pixel electrode 191.

The organic light emitting member 370 includes an emitting layer (not shown) for emitting light, and may have a multi-layered structure including an auxiliary layer (not shown) for enhancing light emitting efficiency of the emitting layer.

The common electrode 270 is formed on the entire surface covering the organic light emitting member 370 and the insulating member 40.

The common electrode 270 and the pixel electrode 191 supply current to the organic light emitting member 370.

The insulating member 40 insulates the connecting member 85 from the common electrode 270.

Now, a method of manufacturing the OLED display shown in FIGS. 16 and 18 will be described in detail with reference to FIGS. 18 to 29.

FIGS. 18, 20, 22, 24, 26, and 28 are top plan views showing steps of an exemplary embodiment of a method of manufacturing the exemplary OLED display shown in FIGS. 16 and 17 according to the present invention. FIG. 19 is a cross-sectional view of the exemplary embodiment of an OLED display taken along line XIX-XIX of FIG. 18. FIG. 21 is a cross-sectional view of the exemplary embodiment of an OLED display taken along line XXI-XXI of FIG. 20. FIG. 23 is a cross-sectional view of the exemplary embodiment of an OLED display taken along line XXIII-XXIII of FIG. 22. FIG. 25 is a cross-sectional view of the exemplary embodiment of an OLED display taken along line XXV-XXV of FIG. 24. FIG. 27 is a cross-sectional view of the exemplary embodiment of an OLED display taken along line XXVII-XXVII of FIG. 26. FIG. 29 is a cross-sectional view of the exemplary embodiment of an OLED display taken along line XXIX-XXIX of FIG. 28.

Figure 18:
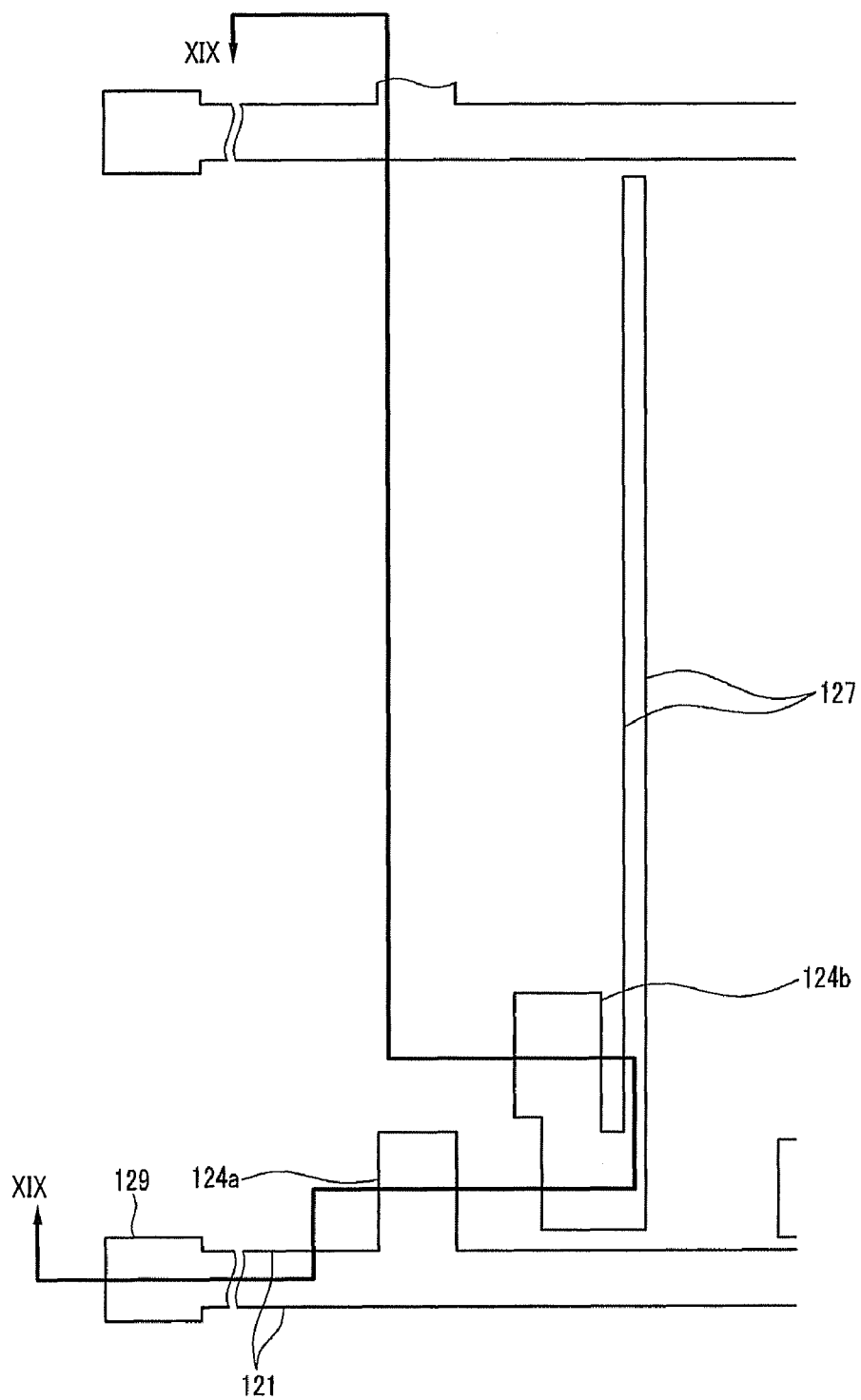
FIGS. 18, 20, 22, 24, 26, and 28 are top plan views showing an exemplary embodiment of a method of manufacturing the exemplary embodiment of an OLED display shown in FIGS. 16 and 17 according to the present invention.
Figure 19:
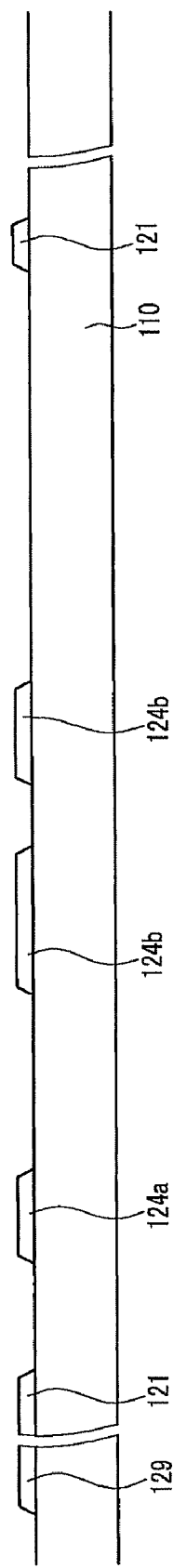
FIG. 19 is a cross-sectional view of the exemplary embodiment of an OLED display taken along line XIX-XIX of FIG. 18.

Referring to FIGS. 18 and 19, gate conductors are formed on a substrate 110. The gate conductors include a plurality of gate lines 121, which further include first control electrodes 124a and end portions 129, and a plurality of second control electrodes 124b, which further include storage electrodes 127.

Figure 20:
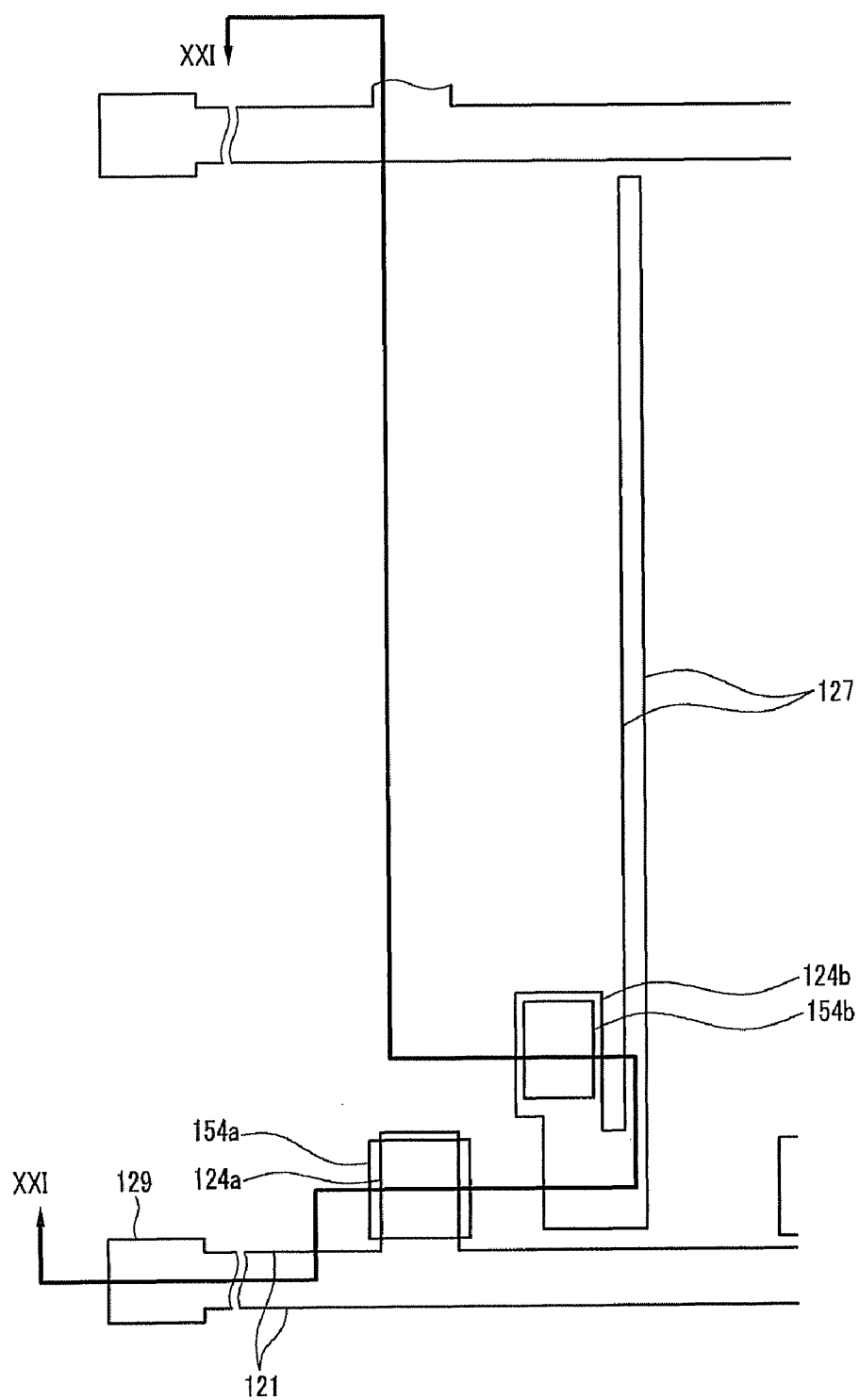
Figure 21:
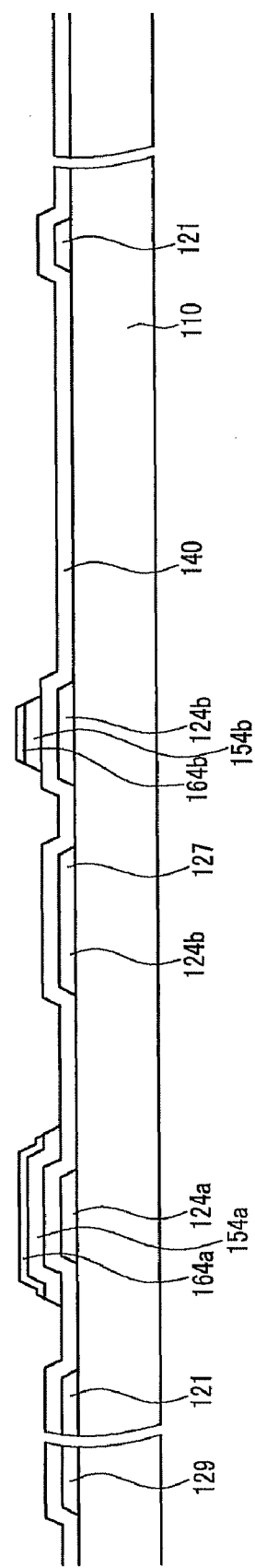
FIG. 21 is a cross-sectional view of the exemplary embodiment of an OLED display taken along line XXI-XXI of FIG. 20.

Next, referring to FIGS. 20 and 21, a gate insulating layer 140, an intrinsic a-Si layer, and an extrinsic a-Si layer are sequentially deposited on the gate conductor and the substrate, and the extrinsic a-Si layer and the intrinsic a-Si layer are patterned by lithography and etching to form a plurality of extrinsic semiconductors 164a and 164b and a plurality of first and second semiconductors 154a and 154b.

Next, data conductors which include a plurality of data lines including first input electrodes 173a and end portions 179, driving voltage lines 172 including second input electrodes 173a, and a plurality of first and second output electrodes 175a and 175b are formed on the gate insulating layer 140 and extrinsic semiconductors 164a and 164b.

Figure 22:
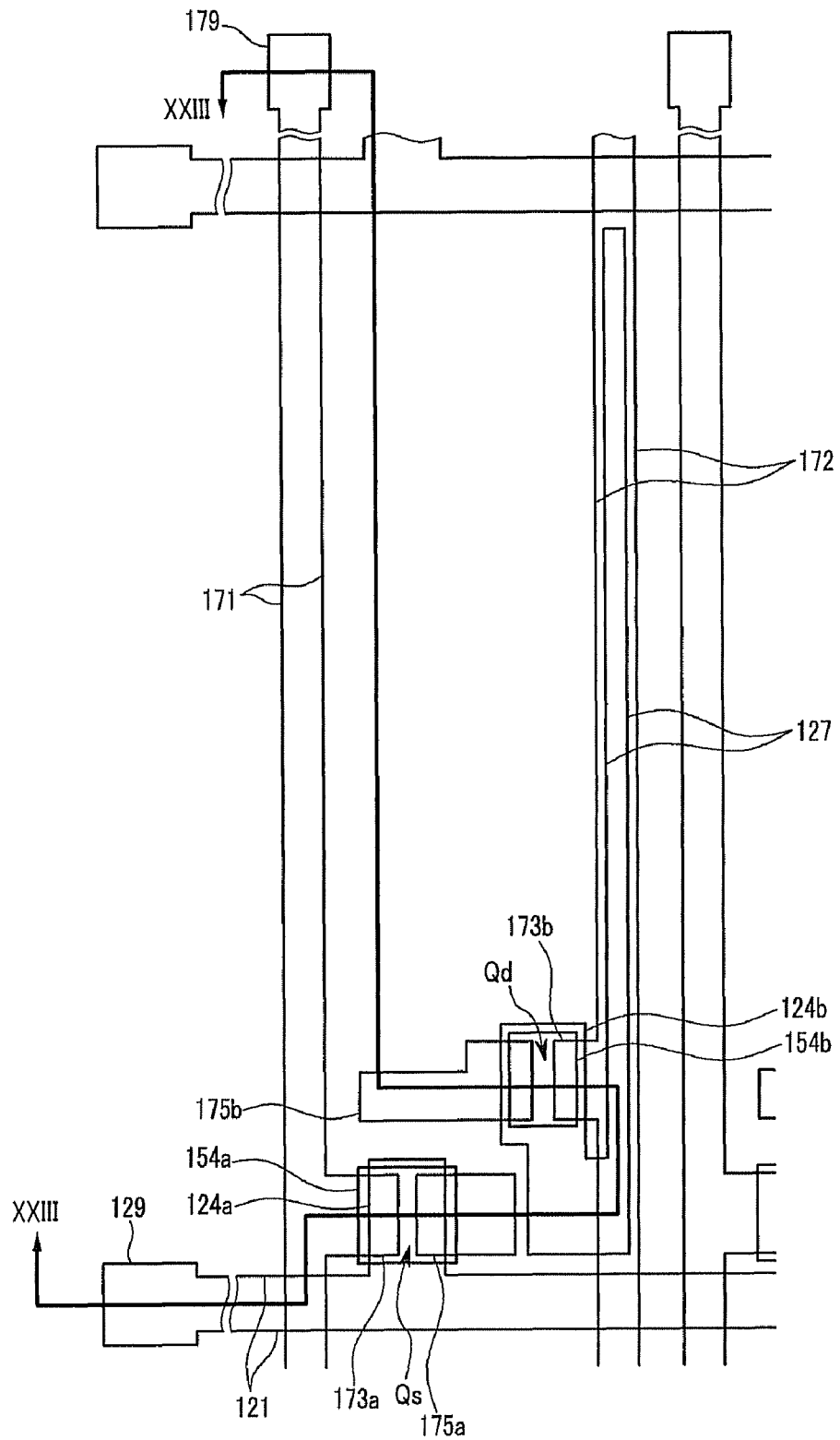
Figure 23:
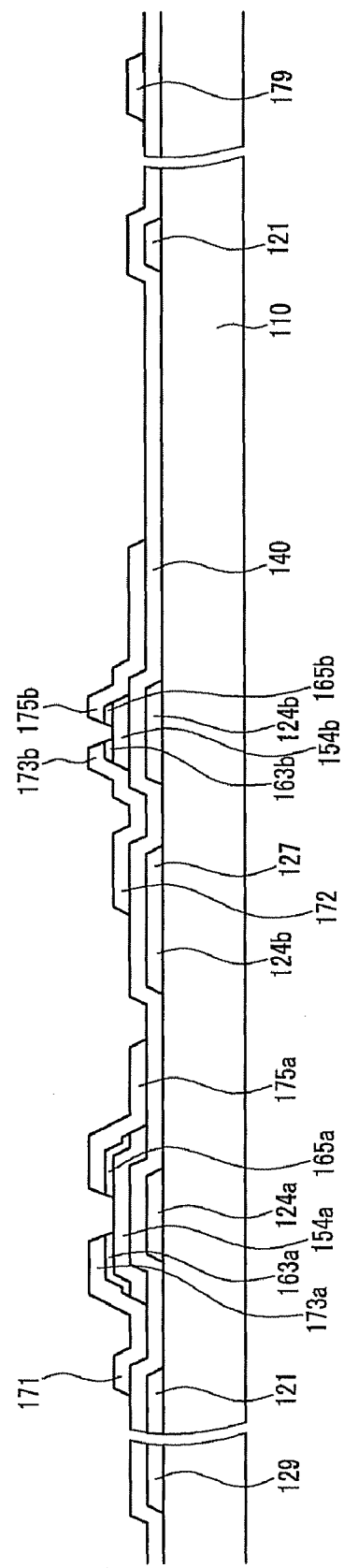
FIG. 23 is a cross-sectional view of the exemplary embodiment of an OLED display taken along line XXIII-XXIII of FIG. 22.

Next, referring to FIGS. 22 and 23, exposed portions of the extrinsic semiconductors 164a and 164b which are not covered with the data conductors 171, 172, 175a and 175b are removed, so that ohmic contacts 163a, 165a, 163b, and 165b are formed, and portions of the first and second conductors 154a and 154b which are disposed under the extrinsic semiconductors 164a and 164b are exposed.

Figure 24:
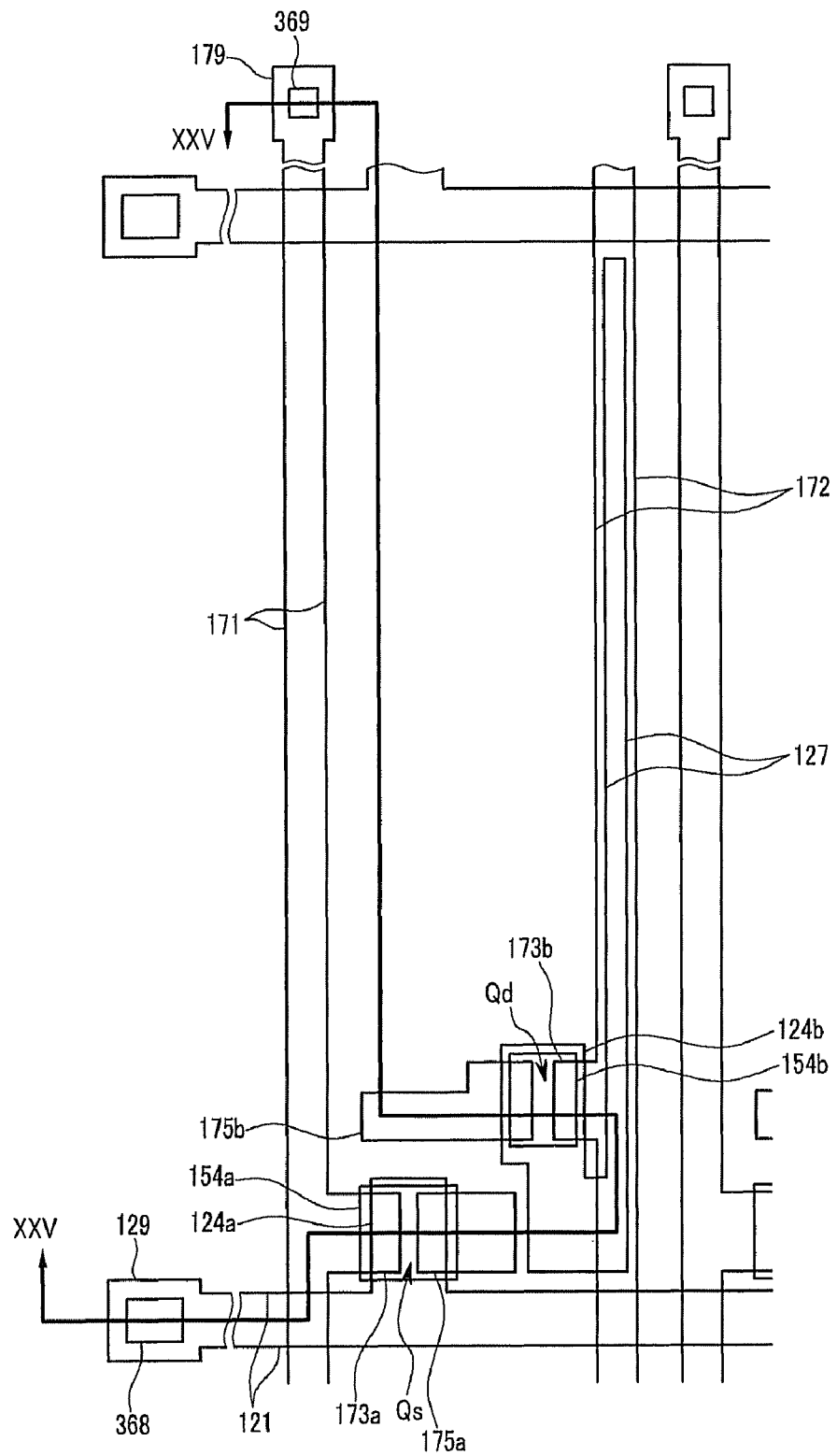
Figure 25:
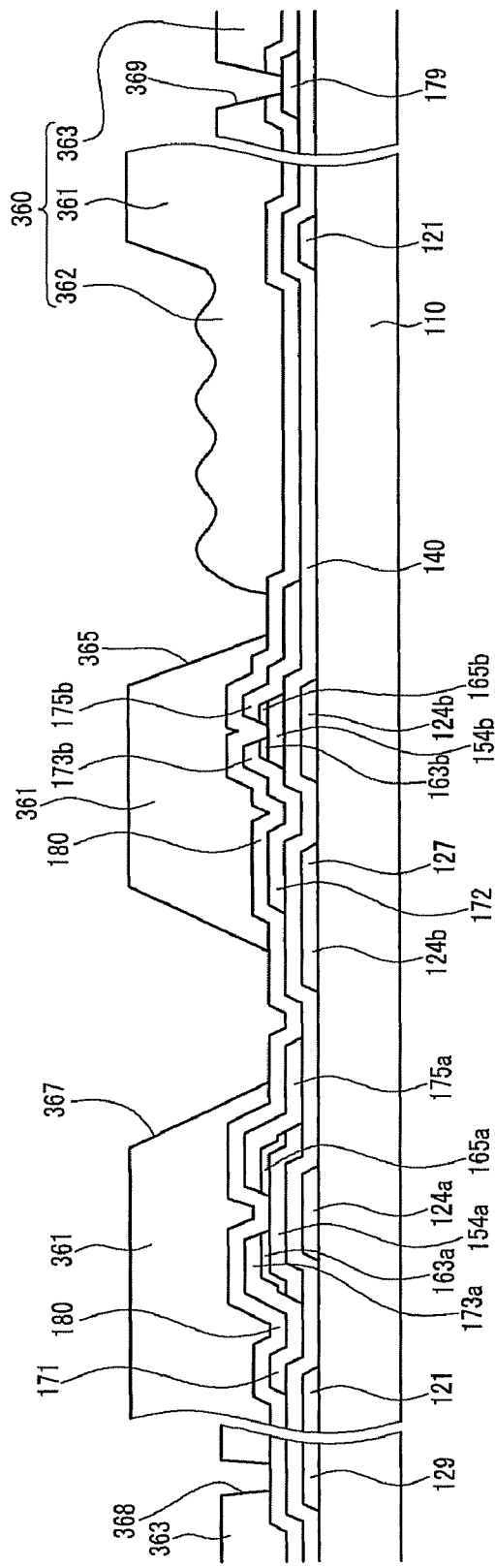
FIG. 25 is a cross-sectional view of the exemplary embodiment of an OLED display taken along line XXV-XXV of FIG. 24.

Next, referring to FIGS. 24 and 25, a passivation layer 180 is deposited on the entire surface of substrate 110 by using a chemical vapor deposition process or the like.

Next, a photosensitive organic solution is coated on the passivation layer 180 by using a spin coating process or the like, and a photosensitive layer 360 including first, second, and third portions 361, 362, and 363 is formed.

Here, the first, second, and third portions 361, 362, and 363 are formed by one mask. The mask has a lattice shape to form a concave-convex shape in the second portion 362, and has a slit structure to form the thin third portion 363.

Figure 26:
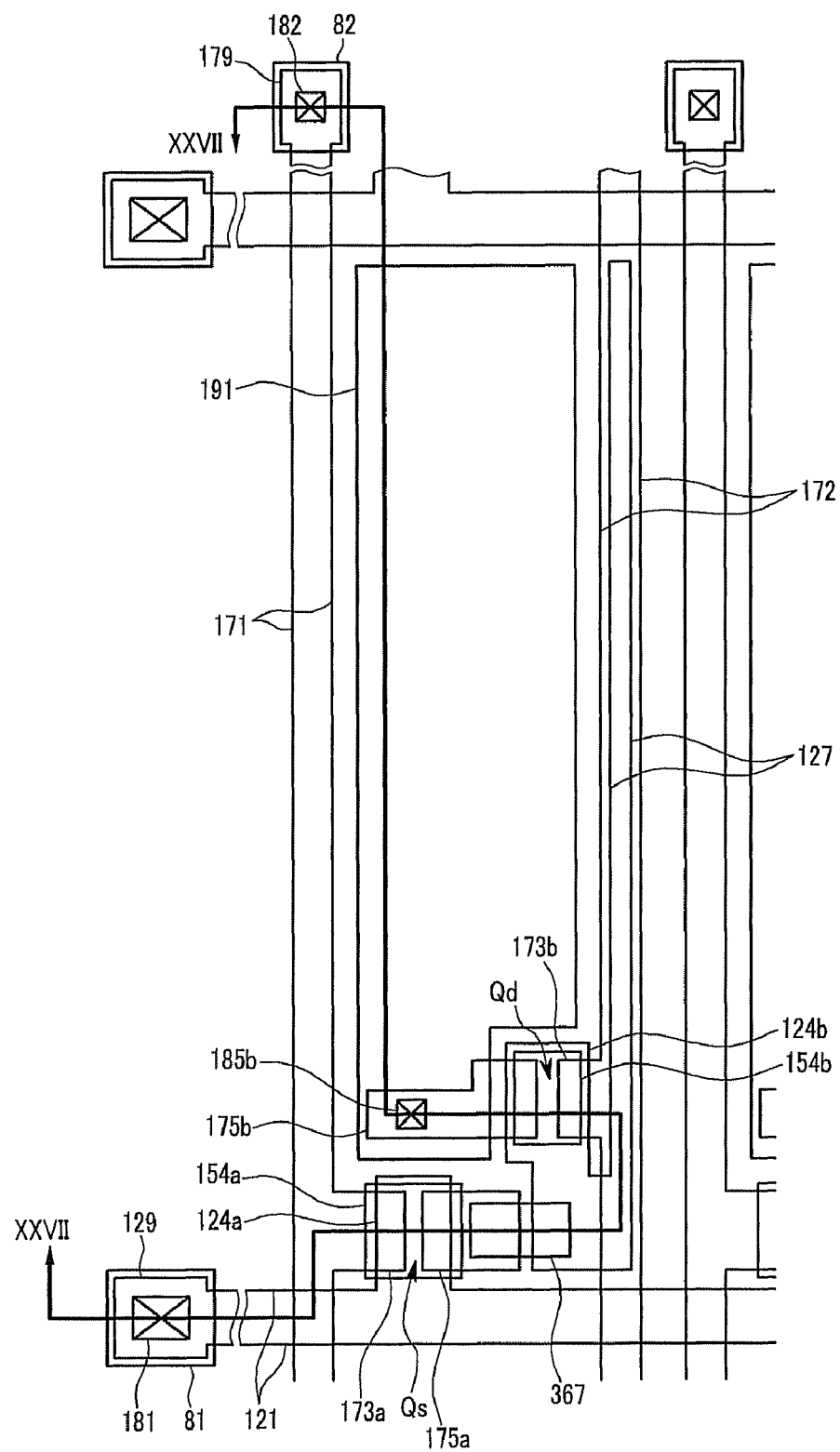
Figure 27:
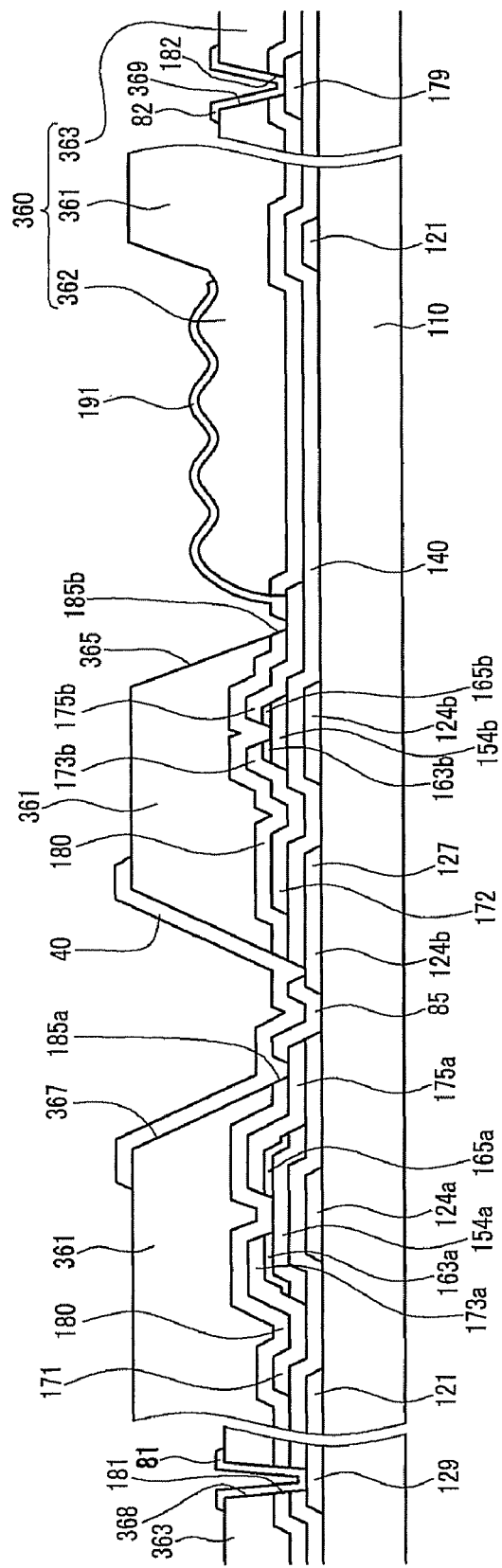
FIG. 27 is a cross-sectional view of the exemplary embodiment of an OLED display taken along line XXVII-XXVII of FIG. 26.

Next, referring to FIGS. 26 and 27, the passivation layer 180 and the gate insulating layer 140 are etched using the photosensitive layer 360 as the mask to form a plurality of contact holes 181, 182, 185a, and 185b.

Next, the photosensitive layer 360 is cured.

As described above, in this exemplary embodiment, after the passivation layer 180 is formed, the photosensitive layer 360 is formed, and the passivation layer is patterned using the photosensitive layer 360 as a mask.

Accordingly, a photolithography process for forming the contact holes 181, 182, 185a, and 185b in the passivation layer 180 may be omitted, so that it is possible to reduce the number of masks and thereby simplify the manufacturing processes.

Next, ITO is deposited on the photosensitive layer 360 and the substrate 110, to form a plurality of pixel electrodes 191, a plurality of connecting members 85, and a plurality of contact assistants 81 and 82.

Next, a shadow mask (not shown) having a predetermined shaped opening portion is placed above the substrate 110, and an insulating material such as a silicon nitride (SiNx) or the like is deposited.

Here, the opening portion of the shadow mask is disposed on the opening 367 which exposes the connecting member 85, so that an insulating member 40 is formed only on the opening 367.

Figure 28:
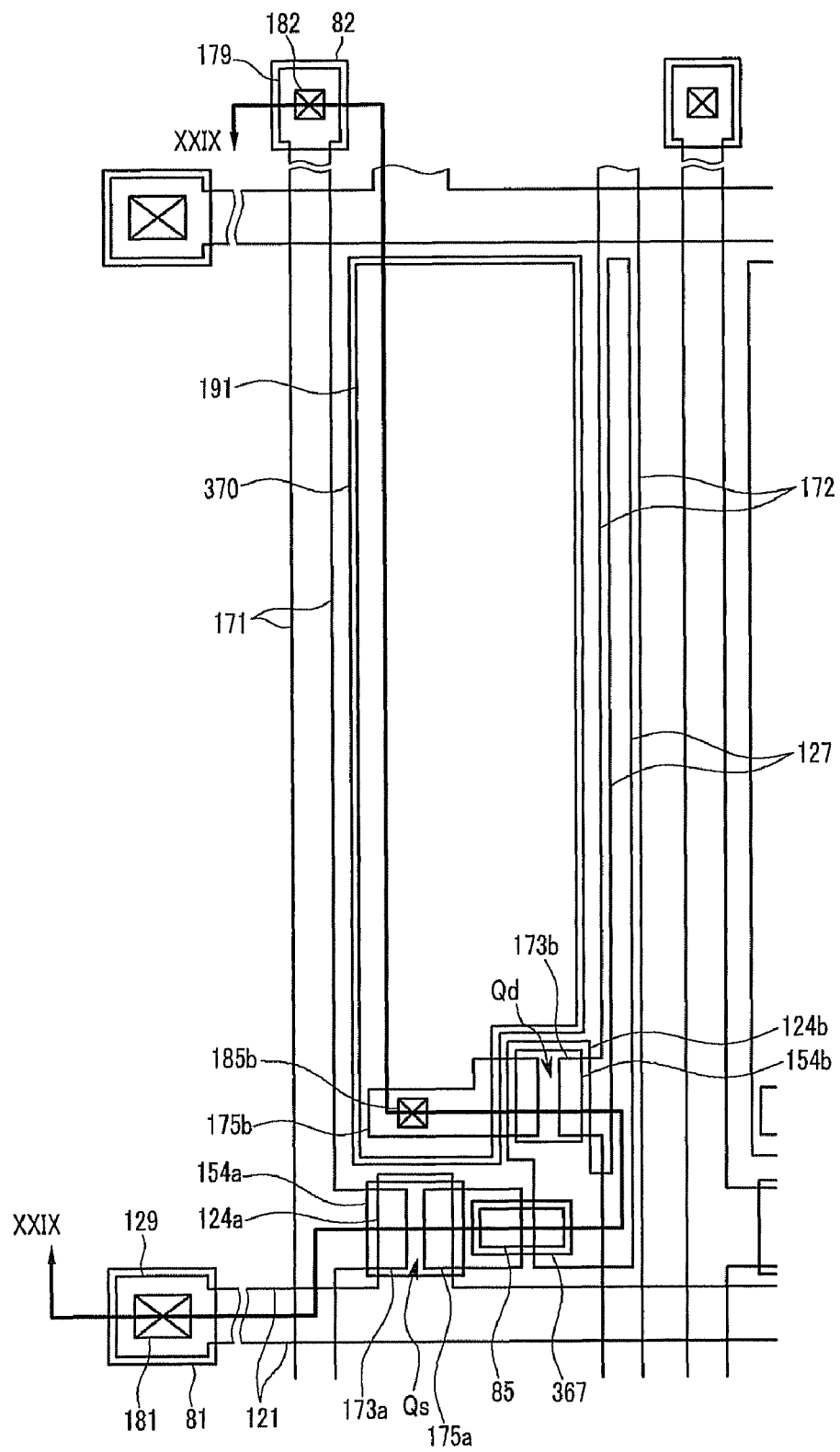
Figure 29:
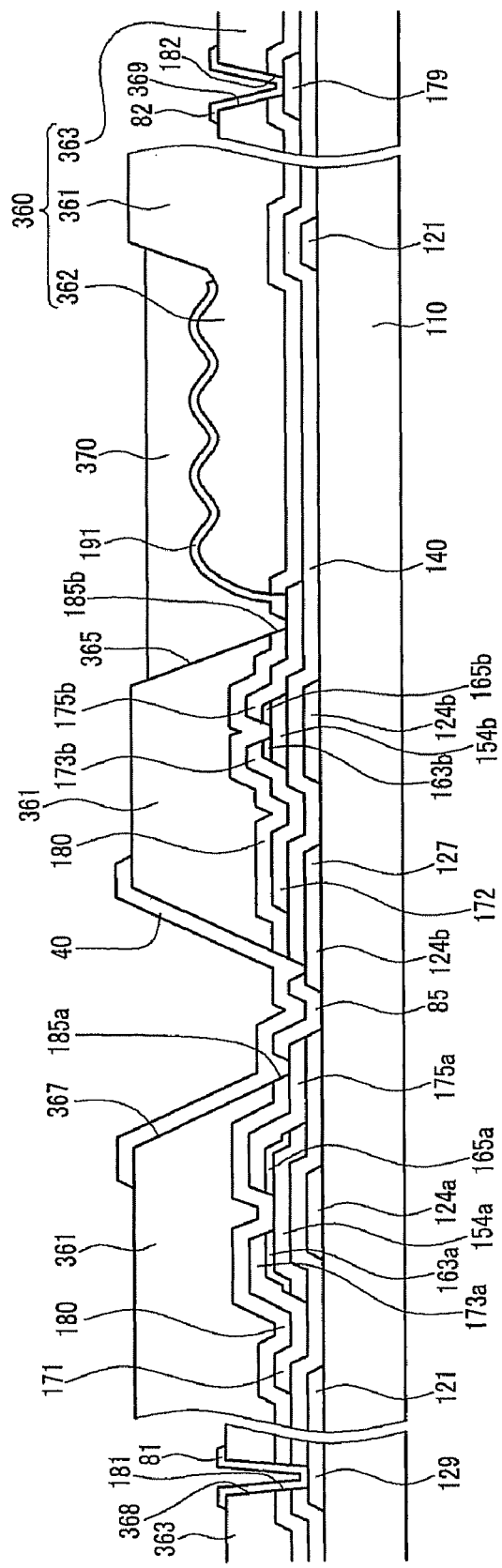
FIG. 29 is a cross-sectional view of the exemplary embodiment of an OLED display taken along line XXIX-XXIX of FIG. 28.

Next, referring to FIGS. 28 and 29, a light emitting member 370 including a hole transport layer (now shown) and an emitting layer (now shown) is formed on the opening 365.

The light emitting member 370 may be formed by a solution process. Exemplary embodiments of such a solution process are an inkjet printing process or a deposition process. This exemplary embodiment uses the inkjet printing process. In the inkjet printing process, an ink is sprayed into the opening 365 by shifting an inkjet head (not shown). In this exemplary embodiment, after each layer is formed, a drying process is performed.

Next, referring to FIGS. 16 and 17, a common electrode 270 is formed on the photosensitive layer 360 and the light emitting member 370.

In this exemplary embodiment, the concave-convex structures are formed by the aforementioned methods. However, various methods of forming the concave-convex shape may be employed. Alternative exemplary embodiments include the configurations in which an organic layer is additionally formed before the pixel electrode is formed and then the pixel electrode is formed on the organic layer, or a method in which the passivation layer is etched to form an intaglio and then the pixel electrode is formed thereon.

As described above, in the present exemplary embodiment, similar to the aforementioned embodiments, the photosensitive layer which is used as the partition walls also serves as the mask to pattern the lower layers, so that it is possible to reduce the number of masks and simplify the manufacturing process.

Unlike the aforementioned embodiments, in the present exemplary embodiment, the surface of the pixel electrode has an embossed shape, so that, as compared with a flat structure, the embossed structure has a larger emission area in terms of the same aperture ratio, and a light-emission amount per unit pixel may be increased.

Although exemplary embodiments and modified examples of the present invention have been described, the present invention is not limited to the exemplary embodiments and examples, but may be modified in various forms without departing from the scope of the appended claims, the detailed description, and the accompanying drawings of the present invention. Therefore, it is natural that such modifications belong to the scope of the present invention.

What is claimed is:

1. An organic light emitting diode display comprising:
   a substrate;
   a first signal line formed on the substrate;
   a second signal line intersecting the first signal line;
   a plurality of thin film transistors formed on the substrate and electrically connected to the first and second signal lines;
   a passivation layer formed on the thin film transistors;
   a photosensitive layer formed on the passivation layer and has a first opening;
   a first electrode connected to one of the thin film transistors and separated from the photosensitive layer;

a light emitting member is formed on the first electrode and is defined by the photosensitive layer; and a second electrode formed on the light emitting member, wherein a lateral surface of one of the thin film transistors contacts the first electrode; and wherein the first electrode contacts the substrate.

2. The organic light emitting diode display of claim 1, wherein the first electrode has an area smaller than that of the first opening.

3. The organic light emitting diode display of claim 1, wherein a boundary of the first electrode is disposed in the first opening and contacts the light emitting member.

4. The organic light emitting diode display of claim 3, wherein the first electrode is disposed inside the first opening and is separated from the photosensitive layer by about 1 μm to about 5 μm.

5. The organic light emitting diode display of claim 1, wherein at least a portion of the light emitting member overlaps the thin film transistors.

6. The organic light emitting diode display of claim 1, wherein the passivation layer is removed from the first opening.

7. The organic light emitting diode display of claim 1, wherein portions of the photosensitive layer surrounding the first opening are used as partition walls.

8. The organic light emitting diode display of claim 1, wherein the photosensitive layer further comprises a second opening, and wherein the light emitting diode display further comprises a connecting member connecting a plurality of thin film transistors, the connecting member being formed in the second opening and separated from the photosensitive layer.

9. The organic light emitting diode display of claim 8, further comprising an insulating layer on the connecting member.

10. The organic light emitting diode display of claim 8, wherein the passivation layer is removed from the second opening.

11. The organic light emitting diode display of claim 8, wherein the connecting member contacts the substrate.

12. The organic light emitting diode display of claim 1, wherein the passivation layer and the photosensitive layer comprise a single-layered organic layer.

13. The organic light emitting diode display of claim 12, wherein the single-layered organic layer comprises a photocurable material.

14. An organic light emitting diode display comprising:
a substrate;
a first signal line formed on the substrate;
a second signal line intersecting the first signal line;
a thin film transistor formed on the substrate and electrically connected to the first and second signal lines;
an insulating layer formed on the thin film transistor and comprising a first portion and a second portion thinner than the first portion, wherein the second portion has a concave and convex portion;
a first electrode formed directly on the second portion of the insulating layer;
a light emitting member formed on the first electrode; and
a second electrode formed on the light emitting member, wherein the first electrode contacts a portion of the thin film transistor,
wherein the light emitting member directly contacts a portion of the thin film transistor.

15. The organic light emitting diode display of claim 14, wherein the insulating layer further comprises a third portion thinner than the first portion, and the third portion is formed on an end portion of at least one of the first and second signal lines.

16. The organic light emitting diode display of claim 14, wherein the insulating layer has a first opening, and a boundary of the first electrode is disposed in the first opening and on the second portion of the insulating layer and contacts the light emitting member.

17. An organic light emitting diode display comprising:
a substrate;
a first signal line formed on the substrate;
a second signal line intersecting the first signal line;
a plurality of thin film transistors formed on the substrate and electrically connected to the first and second signal lines;
a passivation layer formed on the thin film transistors;
partition walls formed on the passivation layer and having a first opening;
a first electrode contacting at least a portion of the substrate in the first opening;
a light emitting member formed on the first electrode and defined by the partition walls; and
a second electrode formed on the light emitting member.

18. The organic light emitting diode display of claim 17, wherein the first electrode has an area which is smaller than that of the first opening.

19. The organic light emitting diode display of claim 18, wherein the first electrode is disposed inside the first opening and is separated from the partition walls by about 1 μm to about 5 μm.

20. The organic light emitting diode display of claim 17, wherein one of the thin film transistors and the first electrode have side contact.

21. The organic light emitting diode display of claim 17, wherein the passivation layer is removed from the first opening.

22. The organic light emitting diode display of claim 17, wherein the partition walls have a second opening, and the light emitting diode display further comprises a connecting member formed in the second opening which contacts the substrate and connects a plurality of the thin film transistors.

23. The organic light emitting diode display of claim 22, further comprising an insulating member on the connecting member.

24. An organic light emitting diode display comprising:
a substrate;
a first signal line formed on the substrate;
a second signal line intersecting the first signal line;
a switching thin film transistor formed on the substrate and connected to the first and second signal lines;
a driving thin film transistor connected to the switching thin film transistor;
a driving voltage line connected to the driving thin film transistor;
a passivation layer formed on substantially the entire surface of the substrate;
a photosensitive layer formed on the passivation layer and having a first opening;
a first electrode connected to the driving thin film transistor and separated from the photosensitive layer;
a light emitting member formed on the first electrode and defined by the photosensitive layer; and
a second electrode formed on the light emitting member, wherein a lateral surface of one of the thin film transistors contacts the first electrode, and
wherein the first electrode contacts the substrate.

* * * * *